United States Patent
Chen et al.

(10) Patent No.: US 12,294,004 B2
(45) Date of Patent: May 6, 2025

(54) FIN FIELD-EFFECT TRANSISTOR AND METHOD OF FORMING THE SAME

(71) Applicant: Taiwan Semiconductor Manufacturing Company, Ltd., Hsinchu (TW)

(72) Inventors: Yi-Chun Chen, Hsinchu (TW); Jih-Jse Lin, Sijhih (TW); Ryan Chia-Jen Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/670,223

(22) Filed: May 21, 2024

(65) Prior Publication Data

US 2024/0304620 A1    Sep. 12, 2024

Related U.S. Application Data

(62) Division of application No. 17/460,049, filed on Aug. 27, 2021, now Pat. No. 12,021,079.

(51) Int. Cl.
*H01L 27/088* (2006.01)
*H01L 21/306* (2006.01)
(Continued)

(52) U.S. Cl.
CPC .... *H01L 27/0886* (2013.01); *H01L 21/30608* (2013.01); *H01L 21/823431* (2013.01);
(Continued)

(58) Field of Classification Search
CPC ............. H01L 29/0649; H01L 29/7851; H01L 29/785; H01L 21/823431; H01L 27/0886;
(Continued)

(56) References Cited

U.S. PATENT DOCUMENTS

| 2015/0243653 A1 | 8/2015 | Hsiao et al. |
| 2016/0155739 A1 | 6/2016 | Ting et al. |

(Continued)

OTHER PUBLICATIONS

Non-Final Office Action on U.S. Appl. No. 17/460,049 Dtd Oct. 24, 2023.
(Continued)

*Primary Examiner* — Mouloucoulaye Inoussa
(74) *Attorney, Agent, or Firm* — FOLEY & LARDNER LLP

(57) ABSTRACT

A semiconductor device includes a substrate; a first fin structure extending along a first lateral direction; a second fin structure extending along the first lateral direction; a first gate structure extending along a second lateral direction and straddles the first fin structure; a second gate structure extending along the second lateral direction and straddles the second fin structure. The semiconductor device further includes a dielectric cut structure that separates the first and second gate structures from each other. The dielectric cut structure extends into the substrate and comprises a first portion and a second portion. A width of the first portion along the second lateral direction increases with increasing depth into the substrate and a width of the second portion along the second lateral direction decreases with increasing depth into the substrate. The second portion is located below the first portion.

20 Claims, 28 Drawing Sheets

(51) Int. Cl.
*H01L 21/8234* (2006.01)
*H01L 29/06* (2006.01)
*H01L 29/66* (2006.01)
*H01L 29/78* (2006.01)

(52) U.S. Cl.
CPC ...... *H01L 29/0649* (2013.01); *H01L 29/6681* (2013.01); *H01L 29/7851* (2013.01)

(58) Field of Classification Search
CPC ........... H01L 21/30608; H01L 21/3065; H01L 29/6681; H01L 29/0673; H01L 29/775; H01L 29/42392; H01L 29/78696; H01L 29/0653; H01L 29/41766; H01L 29/1037; H01L 29/66439; H01L 29/0847; H01L 21/76232; H01L 21/76224; H01L 21/30604; H01L 21/823418; H01L 29/7848; H01L 21/823481; H01L 21/823814; H01L 29/66545; H01L 27/0924; H01L 21/823878; H01L 21/823821; H01L 21/823437; H01L 21/823412; H01L 29/66795; H01L 29/41791; H01L 29/408; H01L 29/7846; B82Y 10/00

See application file for complete search history.

(56) References Cited

U.S. PATENT DOCUMENTS

| | | |
|---|---|---|
| 2016/0336234 A1 | 11/2016 | Kim et al. |
| 2018/0040713 A1 | 2/2018 | Chang et al. |
| 2018/0308769 A1 | 10/2018 | Chang et al. |
| 2019/0334035 A1 | 10/2019 | Chang et al. |
| 2020/0020782 A1 | 1/2020 | Ching et al. |
| 2020/0043920 A1 | 2/2020 | Yoo et al. |
| 2020/0357896 A1 | 11/2020 | Cheng et al. |
| 2021/0036121 A1 | 2/2021 | Lim et al. |
| 2021/0249313 A1 | 8/2021 | Chen et al. |
| 2022/0130978 A1 | 4/2022 | Lin et al. |

OTHER PUBLICATIONS

Notice of Allowance on U.S. Appl. No. 17/460,049 Dtd Feb. 20, 2024.

FIN FIELD-EFFECT TRANSISTOR AND METHOD OF FORMING THE SAME

CROSS-REFERENCE TO RELATED APPLICATION

This application is a divisional application of U.S. Utility application Ser. No. 17/460,049, filed Aug. 27, 2021, titled "FIN FIELD-EFFECT TRANSISTOR AND METHOD OF FORMING THE SAME," which is incorporated by reference herein for all purposes.

BACKGROUND

The present disclosure generally relates to semiconductor devices, and particularly to methods of making a non-planar transistor device.

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

Fin Field-Effect Transistor (FinFET) devices are becoming commonly used in integrated circuits. FinFET devices have a three-dimensional structure that comprises one or more fins protruding from a substrate. A gate structure, configured to control the flow of charge carriers within a conductive channel of the FinFET device, wraps around the one or more fins. For example, in a tri-gate FinFET device, the gate structure wraps around three sides of each of the one or more fins, thereby forming conductive channels on three sides of each of the one or more fins.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
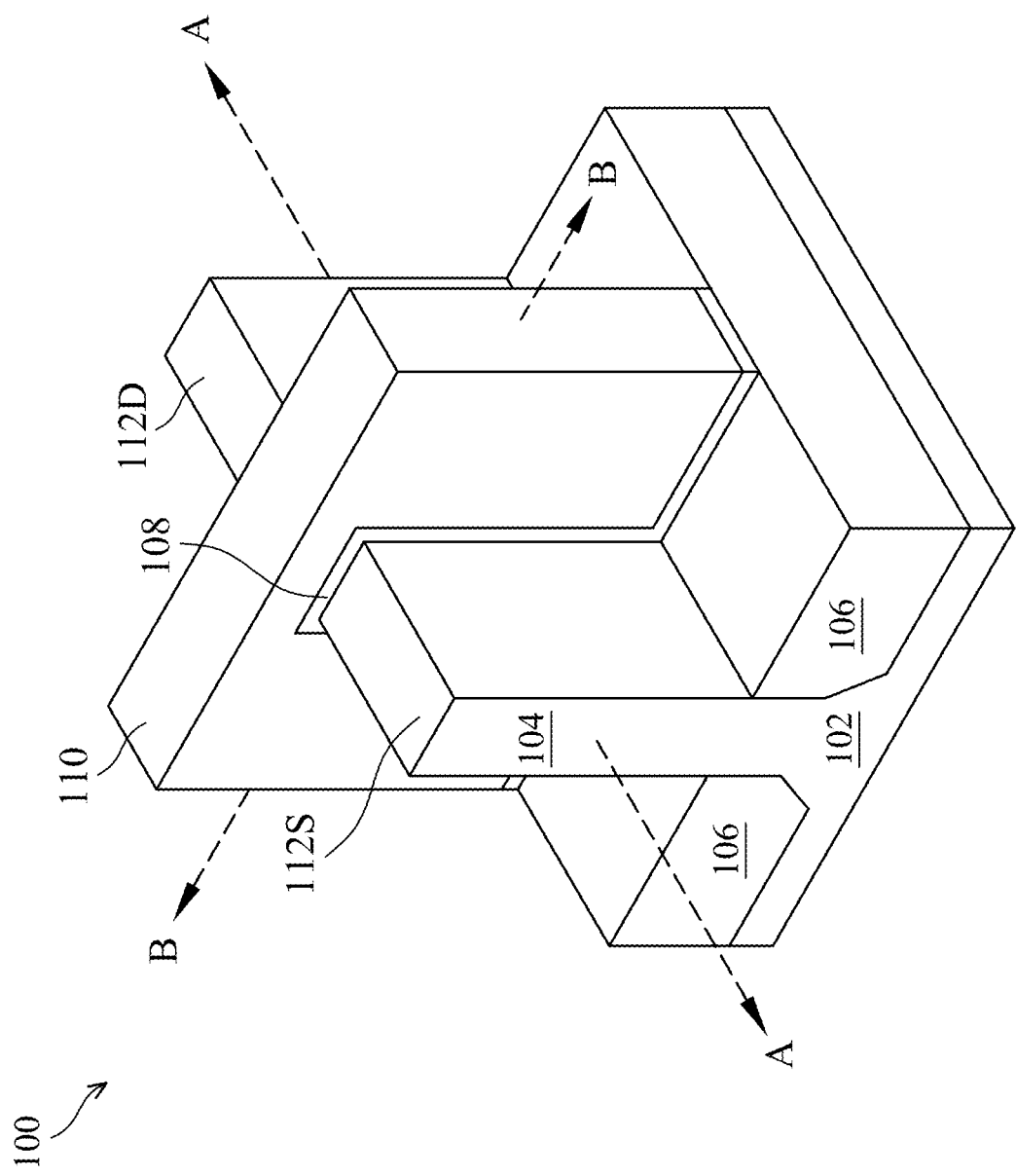
FIG. 1 illustrates a perspective view of a Fin Field-Effect Transistor (FinFET) device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of a semiconductor device that includes a number of transistors (e.g., FinFETs), and a method for forming the same. In some embodiments, the transistors are electrically isolated from each other by a dielectric cut structure, which includes a portion having a diamond-like profile. For example, a first transistor has a first active gate structure over a first fin, and a second transistor has a second active gate structure over a second fin. The diamond-like portion of the dielectric cut structure may penetrate through an isolation structure/region (e.g., a shallow trench isolation (STI)) disposed between the first and second fins. Such a diamond-like portion of the dielectric cut structure can be formed by replacing a fin disposed between the first and second fins with a dielectric material. By forming at least a portion of the dielectric cut structure in the diamond-like profile, a semiconductor material (e.g., silicon), which typically remains along inner sidewalls of the penetrated STI when formed by the existing technologies, can be advantageously removed. As such, undesirable leakage that can be induced by the remaining silicon can be avoided in the semiconductor device, as disclosed herein.

FIG. 1 illustrates a perspective view of an example FinFET device 100, in accordance with various embodiments. The FinFET device 100 includes a substrate 102 and a fin 104 protruding above the substrate 102. Isolation regions 106 are formed on opposing sides of the fin 104, with the fin 104 protruding above the isolation regions 106. A gate dielectric 108 is along sidewalls and over a top surface of the fin 104, and a gate 110 is over the gate dielectric 108. Source region 112S and drain region 112D are in (or extended from) the fin 104 and on opposing sides of the gate dielectric 108 and the gate 110. FIG. 1 is provided as a reference to illustrate a number of cross-sections in subsequent figures. For example, cross-section B-B extends along a longitudinal axis of the gate 110 of the FinFET device 100. Cross-section A-A is perpendicular to cross-section B-B and is along a longitudinal axis of the fin 104 and in a direction of, for example, a current flow between the source/drain regions 112S/112D. Subsequent figures refer to these reference cross-sections for clarity.

Figure 2:
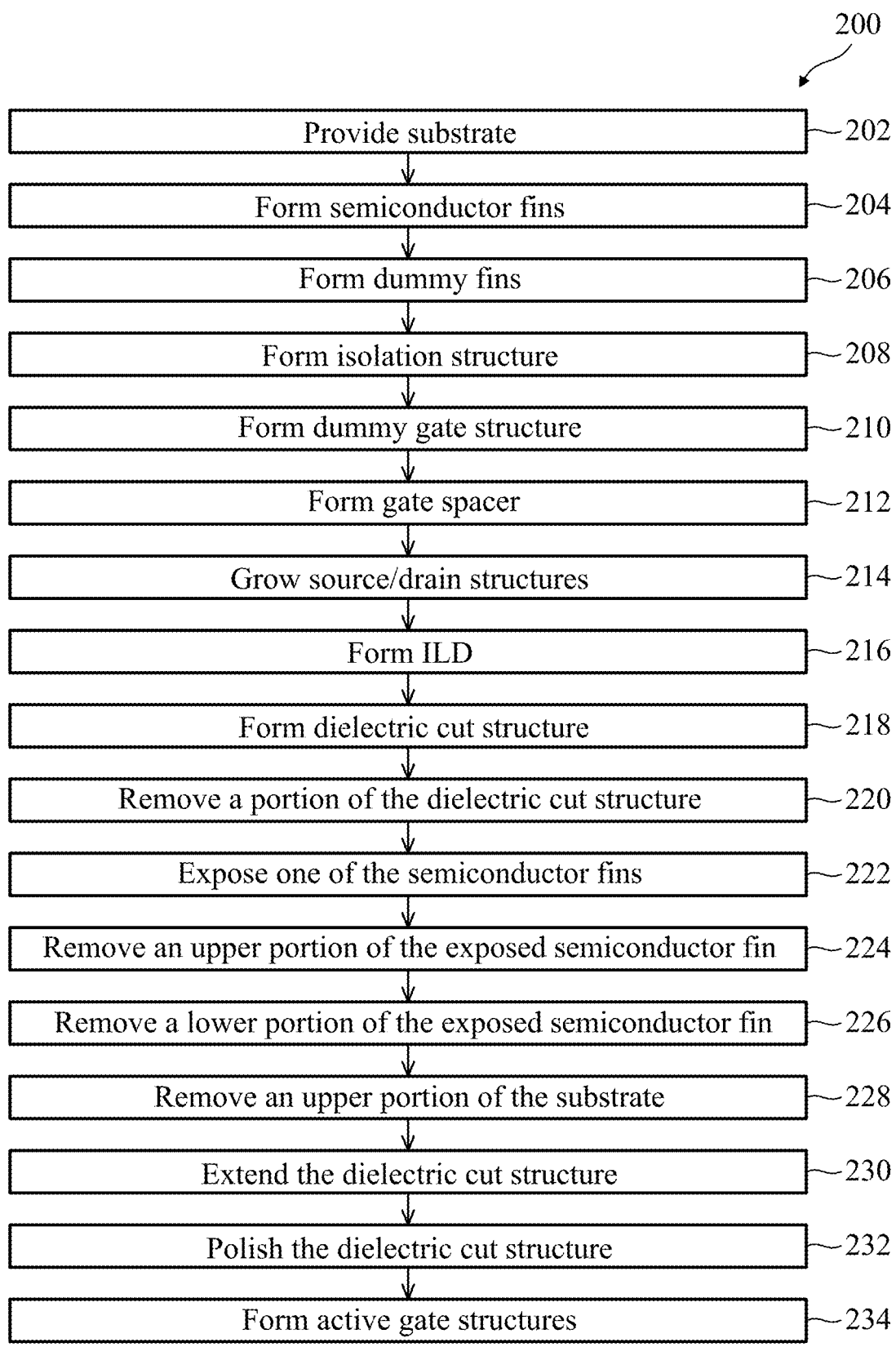
FIG. 2 illustrates a flow chart of an example method for making a non-planar transistor device, in accordance with some embodiments.

FIG. 2 illustrates a flowchart of a method 200 to form a non-planar transistor device, according to one or more embodiments of the present disclosure. For example, at least some of the operations (or steps) of the method 200 can be used to form a FinFET device (e.g., FinFET device 100), a nanosheet transistor device, a nanowire transistor device, a vertical transistor device, or the like. It is noted that the method 200 is merely an example, and is not intended to limit the present disclosure. Accordingly, it is understood that additional operations may be provided before, during, and after the method 200 of FIG. 2, and that some other operations may only be briefly described herein. In some embodiments, operations of the method 200 may be associated with cross-sectional views of an example FinFET device at various fabrication stages as shown in FIGS. 3, 4, 5, 6, 7, 8, 9, 10, 11, 12, 13, 14, 15A, 15B, 16A, 16B, 17A, 17B, 18A, 18B, 19A, 19B, 20A, 20B, 21A, and 21B, respectively, which will be discussed in further detail below.

In brief overview, the method 200 starts with operation 202 of providing a substrate. The method 200 continues to operation 204 of forming a number of semiconductor fins. The method 200 continues to operation 206 of forming a number of dummy fins. The method 200 continues to operation 208 of forming an isolation structure. The method 200 continues to operation 210 of forming a dummy gate structure over the fins. The method 200 continues to operation 212 of forming a gate spacer. The method 200 continues to operation 214 of growing source/drain structures. The method 200 continues to operation 216 of forming an interlayer dielectric (ILD). The method 200 continues to operation 218 of forming a dielectric cut structure. The method 200 continues to operation 220 of removing a portion of the dielectric cut structure. The method 200 continues to operation 222 of exposing one of the semiconductor fins. The method 200 continues to operation 224 of removing an upper portion of the exposed semiconductor fin. The method 200 continues to operation 226 of removing a lower portion of the exposed semiconductor fin. The method 200 continues to operation 228 of removing an upper portion of the substrate. The method 200 continues to operation 230 of extending the dielectric cut structure. The method 200 continues to operation 232 of polishing the dielectric cut structure. The method 200 continues to operation 234 of forming active gate structures.

As mentioned above, FIGS. 3-21B each illustrate, in a cross-sectional view, a portion of a FinFET device 300 at various fabrication stages of the method 200 of FIG. 2. The FinFET device 300 is similar to the FinFET device 100 shown in FIG. 1, but with multiple gate structures and multiple fins. Although FIGS. 3-21B illustrate the FinFET device 300, it is understood the FinFET device 300 may include a number of other devices such as inductors, fuses, capacitors, coils, etc., which are not shown in FIGS. 3-21, for purposes of clarity of illustration.

Figure 3:
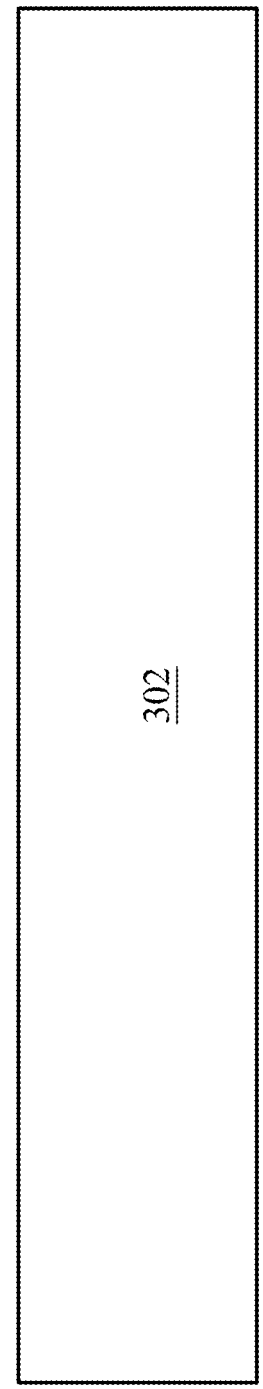
FIGS. 3, 4, 5, 6, 7, 8, 9, 10, 11, 12, 13, 14, 15A, 15B, 16A, 16B, 17A, 17B, 18A, 18B, 19A, 19B, 20A, 20B, 21A, and 21B illustrate cross-sectional views of an example FinFET device (or a portion of the example FinFET device) during various fabrication stages, made by the method of FIG. 2, in accordance with some embodiments.

Corresponding to operation 202 of FIG. 2, FIG. 3 is a cross-sectional view of the FinFET device 300 including a semiconductor substrate 302 at one of the various stages of fabrication, in some embodiments. The cross-sectional view of the FinFET device 300 in FIG. 3 is cut along the lengthwise direction of a gate structure, e.g., cross-section B-B (as indicated in FIG. 1).

The substrate 302 may be a semiconductor substrate, such as a bulk semiconductor, a semiconductor-on-insulator (SOI) substrate, or the like, which may be doped (e.g., with a p-type or an n-type dopant) or undoped. The substrate 302 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 302 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 4:
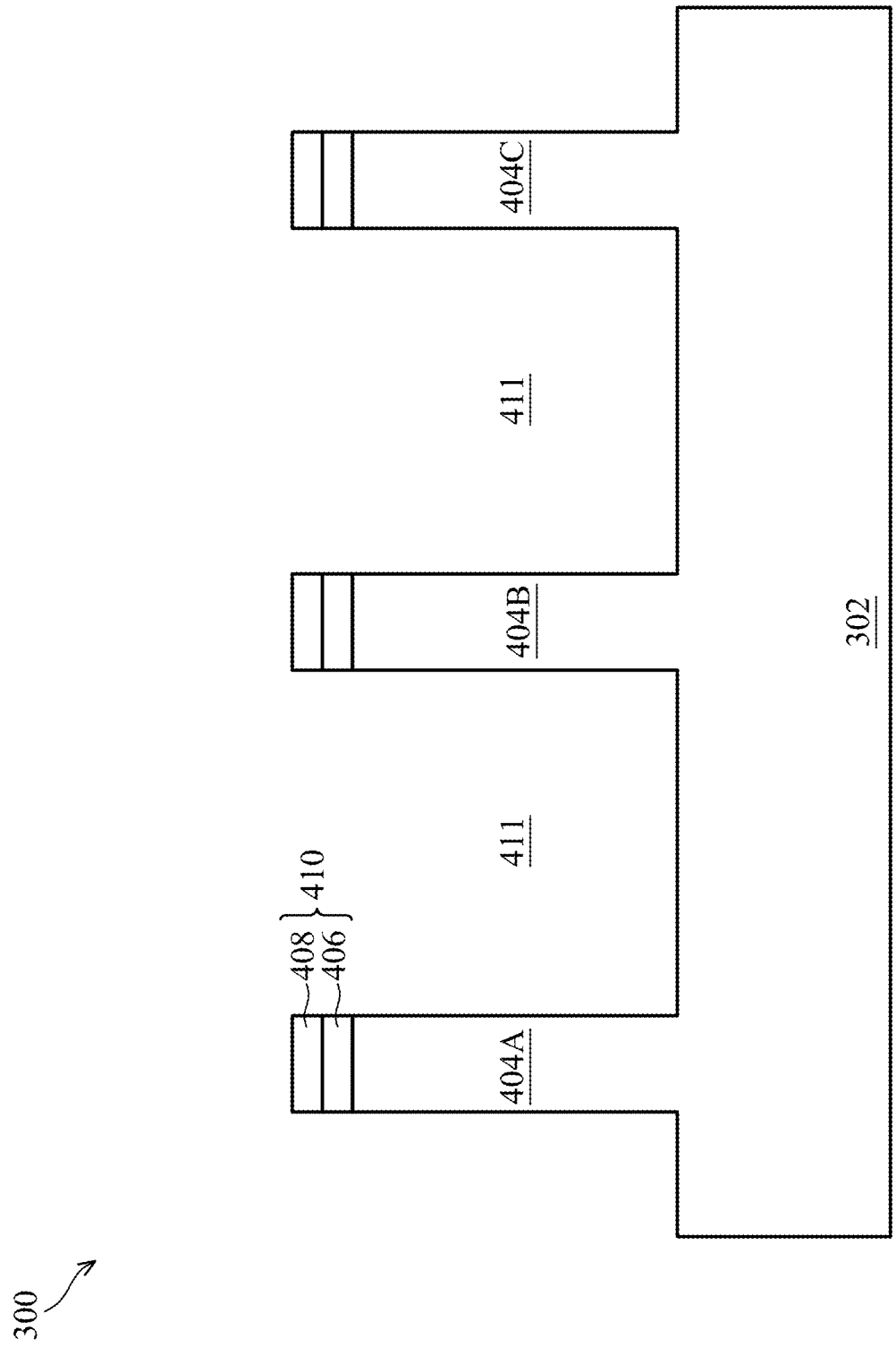

Corresponding to operation 204 of FIG. 2, FIG. 4 is a cross-sectional view of the FinFET device 300 including semiconductor fins 404A, 404B, and 404C at one of the various stages of fabrication, in some embodiments. The cross-sectional view of the FinFET device 300 in FIG. 4 is cut along the lengthwise direction of a gate structure, e.g., cross-section B-B (as indicated in FIG. 1). Although three semiconductor fins are shown, it should be appreciated that the FinFET device 300 can include any number of semiconductor fins while remaining within the scope of the present disclosure.

The semiconductor fins 404A-C are formed by patterning the substrate 302 using, for example, photolithography and etching techniques. For example, a mask layer, such as a pad oxide layer 406 and an overlying pad nitride layer 408, is formed over the substrate 302. The pad oxide layer 406 may be a thin film comprising silicon oxide formed, for example, using a thermal oxidation process. The pad oxide layer 406 may act as an adhesion layer between the substrate 302 and the overlying pad nitride layer 408. In some embodiments, the pad nitride layer 408 is formed of silicon nitride, silicon oxynitride, silicon carbonitride, the like, or combinations thereof. Although only one pad nitride layer 408 is illustrated, a multilayer structure (e.g., a layer of silicon oxide on a layer of silicon nitride) may be formed as the pad nitride layer 408. The pad nitride layer 408 may be formed using low-pressure chemical vapor deposition (LPCVD) or plasma enhanced chemical vapor deposition (PECVD), for example.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer 406 and pad nitride layer 408 to form a patterned mask 410, as illustrated in FIG. 4.

The patterned mask 410 is subsequently used to pattern exposed portions of the substrate 302 to form trenches (or openings) 411, thereby defining the semiconductor fins 404A-C between adjacent trenches 411 as illustrated in FIG. 4. When multiple fins are formed, such a trench may be disposed between any adjacent ones of the fins. In some embodiments, the semiconductor fins 404A-C are formed by etching trenches in the substrate 302 using, for example, reactive ion etch (RIE), neutral beam etch (NBE), the like, or combinations thereof. The etch may be anisotropic. In some embodiments, the trenches 411 may be strips (viewed from the top) parallel to each other, and closely spaced with respect to each other. In some embodiments, the trenches 411 may be continuous and surround the semiconductor fins 404A-C.

The semiconductor fins 404A-C may be patterned by any suitable method. For example, the semiconductor fins 404A-C may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin.

FIGS. 3 and 4 illustrate an embodiment of forming the semiconductor fins 404A-C, but a fin may be formed in various different processes. For example, a top portion of the substrate 302 may be replaced by a suitable material, such as an epitaxial material suitable for an intended type (e.g., N-type or P-type) of semiconductor devices to be formed. Thereafter, the substrate 302, with epitaxial material on top, is patterned to form the semiconductor fins 404A-C that include the epitaxial material.

As another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form one or more fins.

In yet another example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form one or more fins.

In embodiments where epitaxial material(s) or epitaxial structures (e.g., the heteroepitaxial structures or the homoepitaxial structures) are grown, the grown material(s) or structures may be in situ doped during growth, which may obviate prior and subsequent implantations although in situ and implantation doping may be used together. Still further, it may be advantageous to epitaxially grow a material in an NMOS region different from the material in a PMOS region. In various embodiments, the semiconductor fins 404A-C may include silicon germanium ($Si_xGe_{1-x}$, where x can be between 0 and 1), silicon carbide, pure or pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 5:
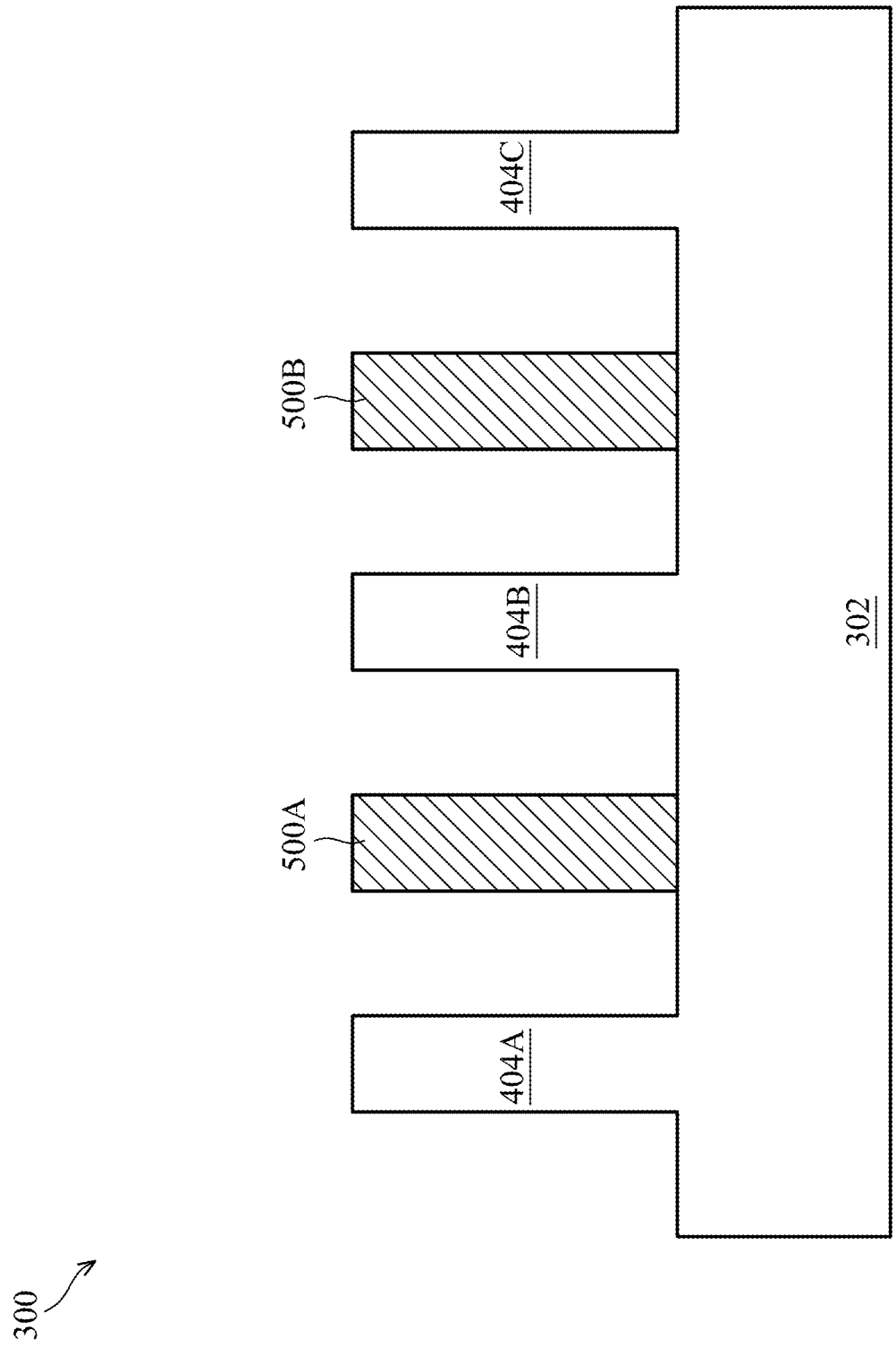

Corresponding to operation 206 of FIG. 2, FIG. 5 is a cross-sectional views of the FinFET device 300 including dummy fins 500A and 500B at one of the various stages of fabrication, in some embodiments. The cross-sectional view of the FinFET device 300 in FIG. 5 is cut along the lengthwise direction of a gate structure, e.g., cross-section B-B (as indicated in FIG. 1). The dummy fins 500A-B may each be disposed between adjacent semiconductor fins, e.g., between semiconductor fins 404A and 404B, and between semiconductor fins 404B and 404C, as shown in FIG. 5 (and the following figures). It should be appreciated that the dummy fins 500A-B may be optionally formed, in some embodiments.

To form the dummy fins 500A-B, a dummy channel layer, which includes a dielectric material, is formed over the substrate 302 to overlay the semiconductor fins 404A-C. The dielectric material, for example, may include silicon oxide, silicon nitride, silicon oxynitride, silicon carbide, silicon carbonitride, silicon oxycarbonitride, silicon oxycarbide, or combinations thereof. In another example, the dielectric material may include group IV-based oxide or group IV-based nitride, e.g., tantalum nitride, tantalum oxide, hafnium oxide, or combinations thereof. The dummy channel layer may be formed using low-pressure chemical vapor deposition (LPCVD) or plasma enhanced chemical vapor deposition (PECVD), for example.

Upon depositing the dummy channel layer overlaying the semiconductor fins 404A-C, the dummy fins, e.g., 500A and 500B, may be formed between the semiconductor fins 404A-C. For example, the dummy fin 500A may be formed between the semiconductor fins 404A and 404B; and the dummy fin 500B may be formed between the semiconductor fins 404B and 404C. The dummy fins 500A-B are formed by patterning the dummy channel layer using, for example, photolithography and etching techniques. For example, a patterned mask may be formed over the dummy channel layer to mask portions of the dummy channel layer to form the dummy fins 500A-B. Subsequently, unmasked portions of the dummy channel layer may be etched using, for example, reactive ion etch (RIE), neutral beam etch (NBE), the like, or combinations thereof, thereby defining the dummy fins 500A-B between adjacent semiconductor fins (or in the trenches 411) as illustrated in FIG. 5. The etch may be anisotropic, in some embodiments. Following the formation of the dummy fins, an isolation structure (e.g., STI 600 of FIG. 6) may be formed between adjacent fins. However, in some other embodiments, the dummy fins 500A-B may be formed concurrently with or subsequently to forming such an isolation structure, which will be discussed below.

Figure 6:

Corresponding to operation 208 of FIG. 2, FIG. 6 is a cross-sectional view of the FinFET device 300 including an isolation structure 600 at one of the various stages of fabrication, in some embodiments. The cross-sectional view of the FinFET device 300 in FIG. 6 is cut along the lengthwise direction of a gate structure, e.g., cross-section B-B (as indicated in FIG. 1).

The isolation structure 600, which is formed of an insulation material, can electrically isolate neighboring fins from each other. The insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. In an example, the insulation material is silicon oxide formed by a FCVD process. An anneal process may be performed once the insulation material is formed. A planarization process, such as a chemical mechanical polish (CMP), may remove any excess insulation material and form top surfaces of the isolation structure 600 and a top surface of the fins 404A-C and 500A-B that are coplanar (not shown). The patterned mask 410 (FIG. 4) may also be removed by the planarization process.

In some embodiments, the isolation structure 600 includes a liner, e.g., a liner oxide (not shown), at the interface between the isolation structure 600 and the substrate 302 (semiconductor fins 404A-C). In some embodiments, the liner oxide is formed to reduce crystalline defects at the interface between the substrate 302 and the isolation structure 600. Similarly, the liner oxide may also be used to reduce crystalline defects at the interface between the semiconductor fins 404A-C and the isolation structure 600. The liner oxide (e.g., silicon oxide) may be a thermal oxide formed through a thermal oxidation of a surface layer of the substrate 302, although other suitable method may also be used to form the liner oxide.

Next, the isolation structure 600 is recessed to form shallow trench isolations (STIs) 600, as shown in FIG. 6. The isolation structure 600 is recessed such that the upper portions of the fins 404A-C and 500A-B protrude from between neighboring STIs 600. Respective top surfaces of the STIs 600 may have a flat surface (as illustrated), a convex surface, a concave surface (such as dishing), or combinations thereof. The top surfaces of the STIs 600 may be formed flat, convex, and/or concave by an appropriate etch. The isolation structure 600 may be recessed using an acceptable etching process, such as one that is selective to the material of the isolation structure 600. For example, a dry etch or a wet etch using dilute hydrofluoric (DHF) acid may be performed to recess the isolation structure 600.

Figure 7:
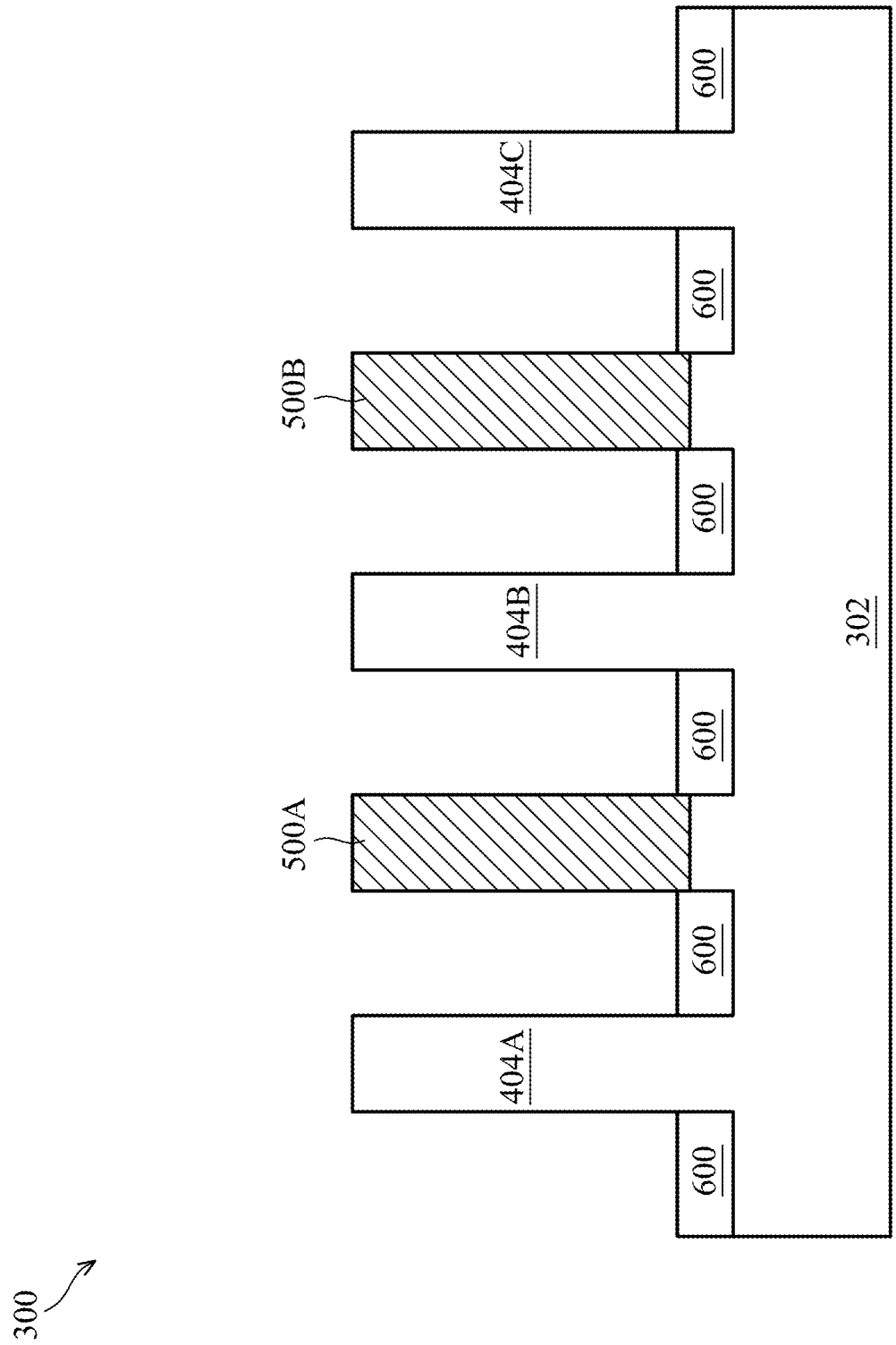

As mentioned above, the dummy fins 500A-B may be formed concurrently with or subsequently to the formation of the isolation structure 600. As an example, when forming the semiconductor fins 404A-C (FIG. 4), one or more other semiconductor fins may also be formed in the trenches 411. The insulation material of the isolation structure 600 may be deposited over the semiconductor fins, followed by a CMP process to planarize the top surfaces of the isolation structure 600 and the semiconductor fins, which include the semiconductor fins 404A-C and the semiconductor fins formed in the trenches 411. Subsequently, an upper portion of the semiconductor fins formed in the trenches 411 may be partially removed to form cavities. The cavities are then filled with the dielectric material of the dummy channel layer, followed by another CMP process to form the dummy fins 500A-B. The isolation structure 600 is recessed to form the shallow trench isolations (STIs) 600, as shown in FIG. 7. Using such a method to form the dummy fins 500A-B, the dummy fins 500A-B are formed on the substrate 302 and a bottom surface of the dummy fins 500A-B is below the top surface of the isolation structure 600, as shown in FIG. 7. Depending on how much of the isolation structure 600 is recessed, the bottom surface of the dummy fins 500A-B may be above the top surface of the isolation structure 600, while remaining within the scope of the present disclosure.

Figure 8:
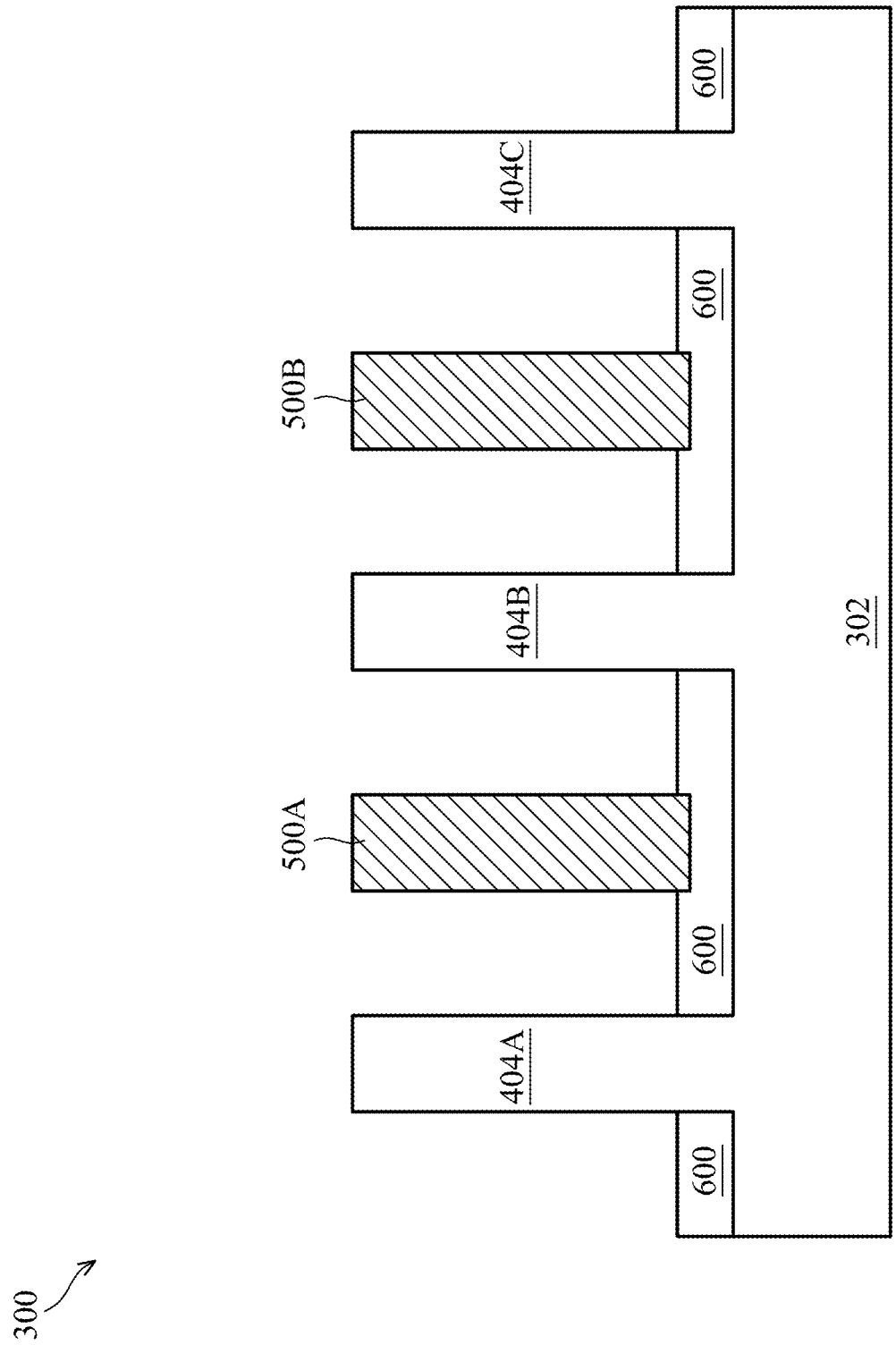

As another example, after forming the semiconductor fins 404A-C (FIG. 4), the insulation material of the isolation structure 600 may be deposited over the semiconductor fins 404A-C in a controlled deposition rate, thereby causing cavities to be spontaneously formed in the trenches 411. The cavities are then filled with the dielectric material of the dummy channel layer, followed by a CMP process to form the dummy fins 500A-B. The isolation structure 600 is recessed to form the shallow trench isolations (STIs) 600, as shown in FIG. 8. Using such a method to form the dummy fins 500A-B, the dummy fins 500A-B are formed on the isolation structure 600 and a bottom surface of the dummy fins 500A-B is embedded in the corresponding isolation structure 600, as shown in FIG. 8. As yet another example, after forming the semiconductor fins 404A-C (FIG. 4) and depositing the insulation material of the isolation structure 600 over the semiconductor fins 404A-C, a patterned mask may be formed over the isolation structure 600 to expose portions of the isolation structure 600 to form the dummy fins 500A-B (e.g., in the trenches 411). Subsequently, the exposed portions of the isolation structure 600 may be etched using, for example, reactive ion etch (RIE), neutral beam etch (NBE), the like, or combinations thereof, thereby defining cavities. The cavities are then filled with the dielectric material of the dummy channel layer, followed by a CMP process to form the dummy fins 500A-B, which is similar to the illustrated embodiment of FIG. 8. In the following discussions, the configuration of the dummy fins and isolation structure shown in FIG. 6 will be used as a representative example.

Figure 9:
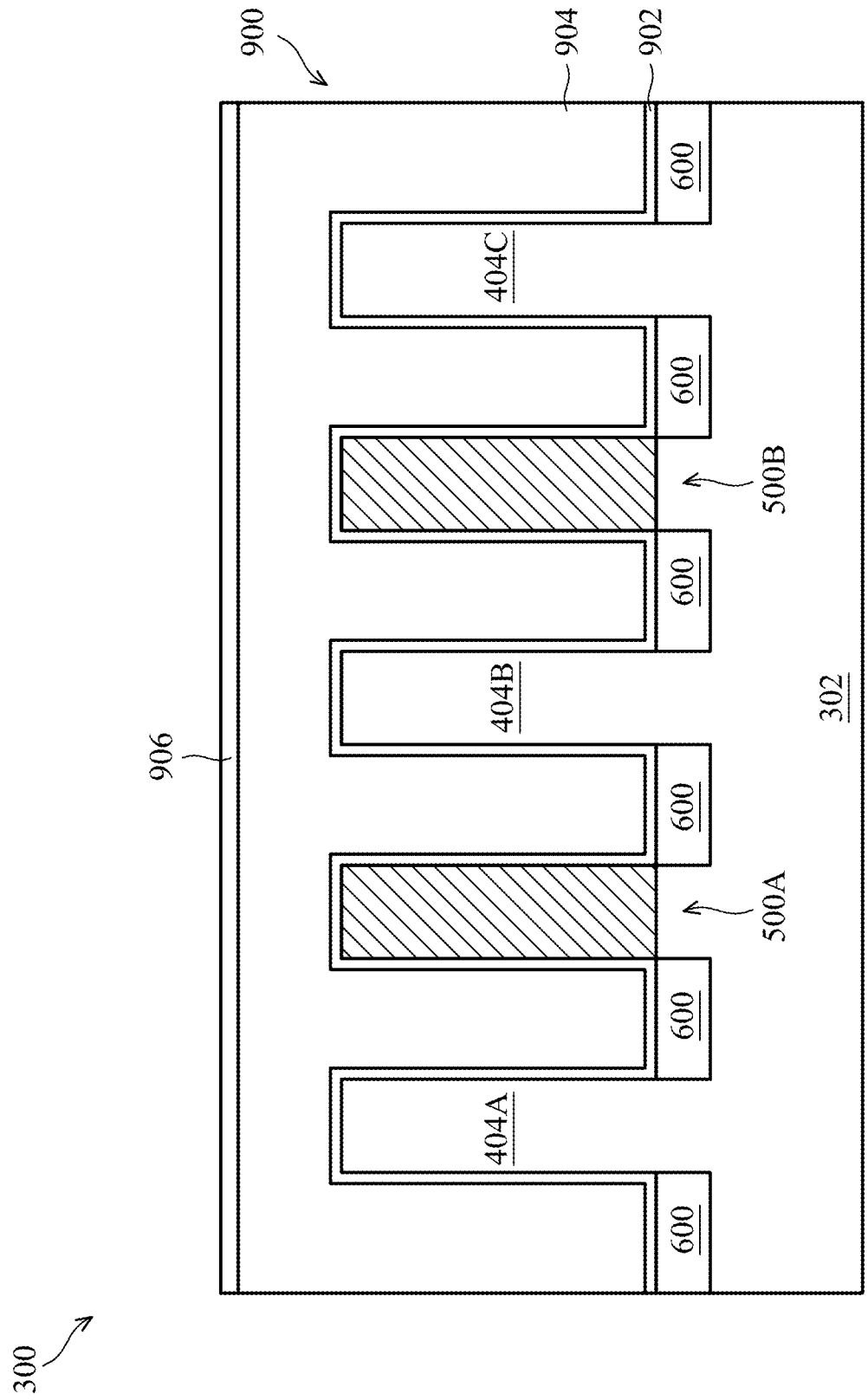

Corresponding to operation 210 of FIG. 2, FIG. 9 is a cross-sectional view of the FinFET device 300 including a dummy gate structure 900 at one of the various stages of fabrication, in some embodiments. The cross-sectional view of the FinFET device 300 in FIG. 9 is cut along the lengthwise direction of a gate structure, e.g., cross-section B-B (as indicated in FIG. 1). The dummy gate structure 900 is formed to overlay a respective portion of each of the fins (e.g., semiconductor fins 400B-C, dummy fins 500A-B).

The dummy gate structure 900 includes a dummy gate dielectric 902 and a dummy gate 904, in some embodiments. A mask 906 may be formed over the dummy gate structure 900. To form the dummy gate structure 900, a dielectric layer is formed on the semiconductor fins 404B-C and dummy fins 500A-B. The dielectric layer may be, for example, silicon oxide, silicon nitride, silicon oxynitride, silicon carbide, silicon carbonitride, silicon oxycarbonitride, silicon oxycarbide, multilayers thereof, or the like, and may be deposited or thermally grown.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using suitable lithography and etching techniques to form the mask 906. The pattern of the mask 906 then may be transferred to the gate layer and the dielectric layer by a suitable etching technique to form the dummy gate 904 and the underlying dummy gate dielectric 902, respectively. The dummy gate 904 and the dummy gate dielectric 902 cover a respective portion (e.g., a channel region) of each of the semiconductor fins 404B-C and the dummy fins 500A-B. The dummy gate 904 may also have a lengthwise direction (e.g., direction B-B of FIG. 1) perpendicular to the lengthwise direction (e.g., direction of A-A of FIG. 1) of the fins.

The dummy gate dielectric 902 is shown to be formed over the semiconductor fins 404B-C and the dummy fins 500A-B (e.g., over the respective top surfaces and the sidewalls of the fins) and over the STIs 600 in the example of FIG. 9. In other embodiments, the dummy gate dielectric 902 may be formed by, e.g., thermal oxidization of a material of the fins, and therefore, may be formed over the fins but not over the STIs 600. It should be appreciated that these and other variations are still included within the scope of the present disclosure.

Figure 10:
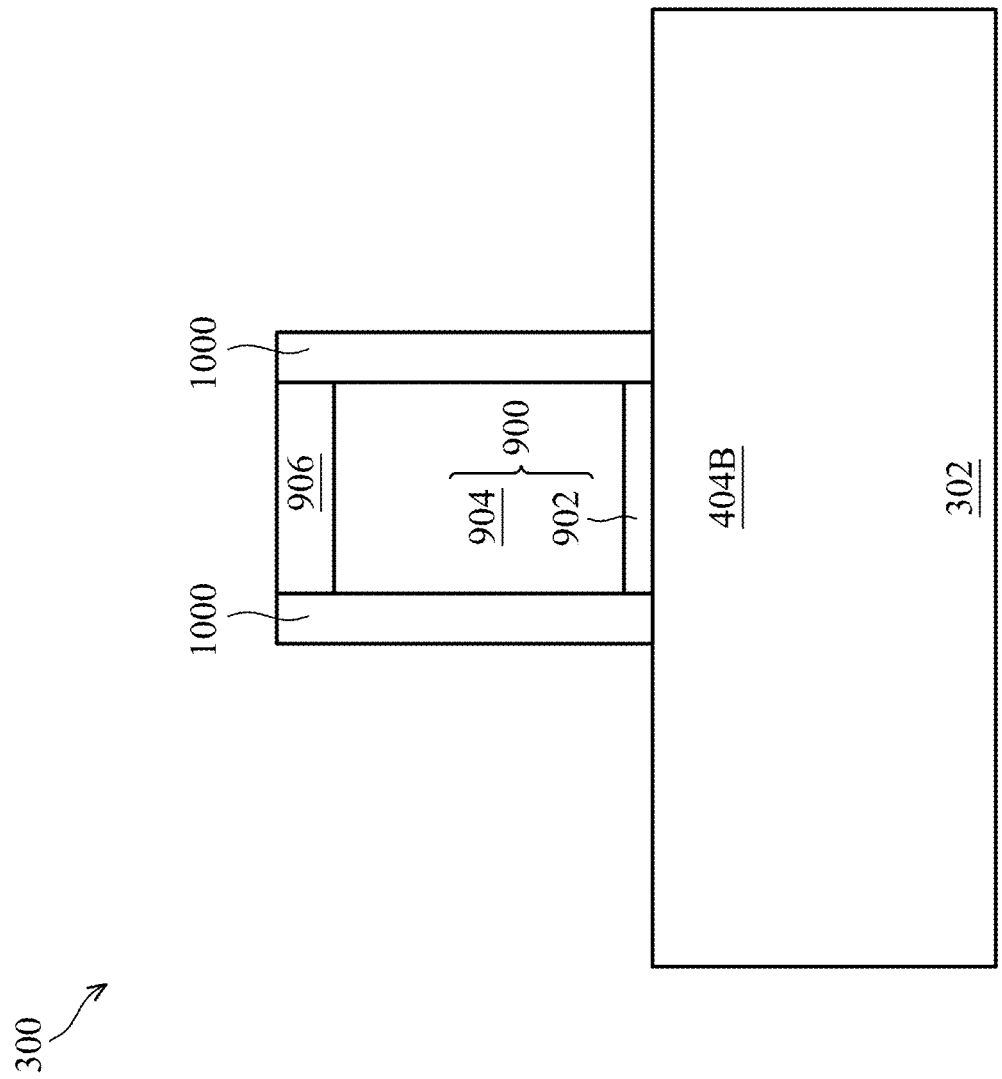
Figure 11:
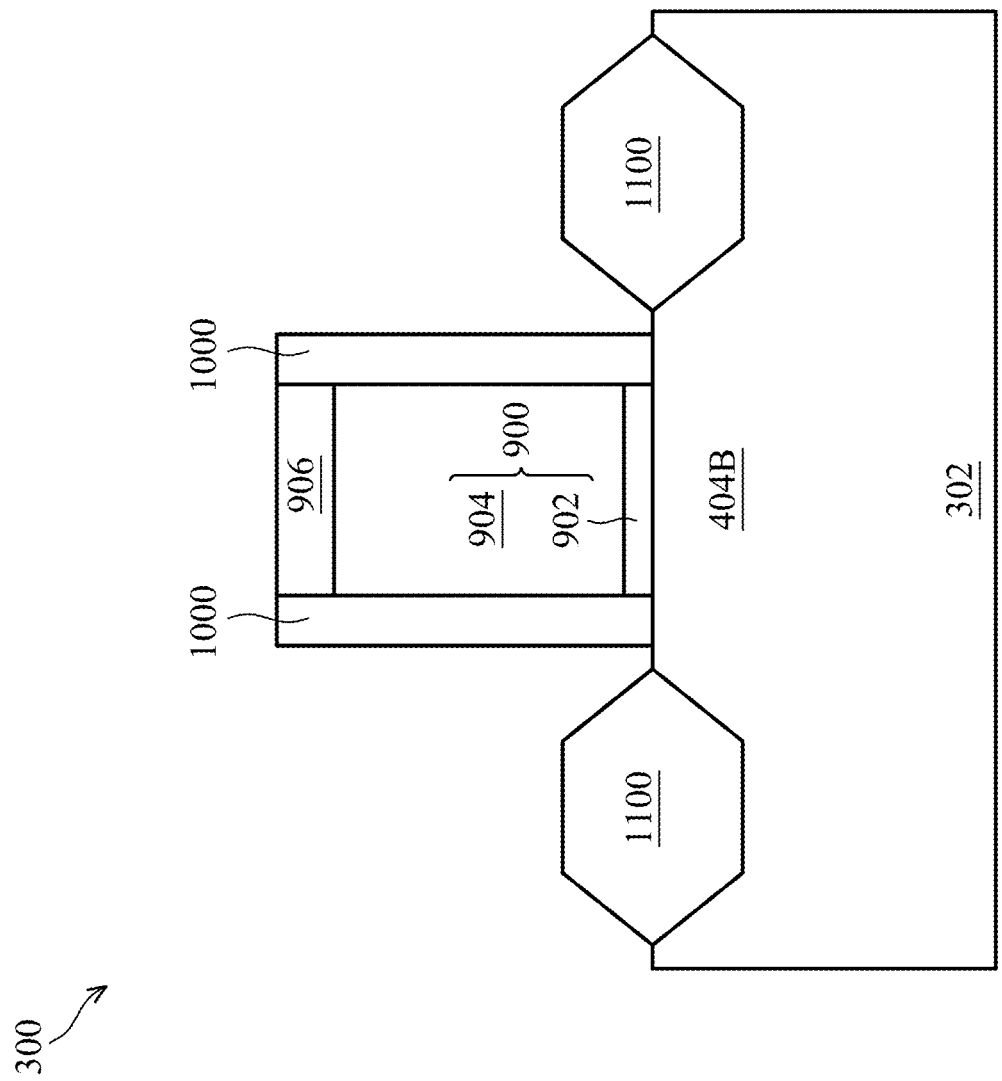
Figure 12:
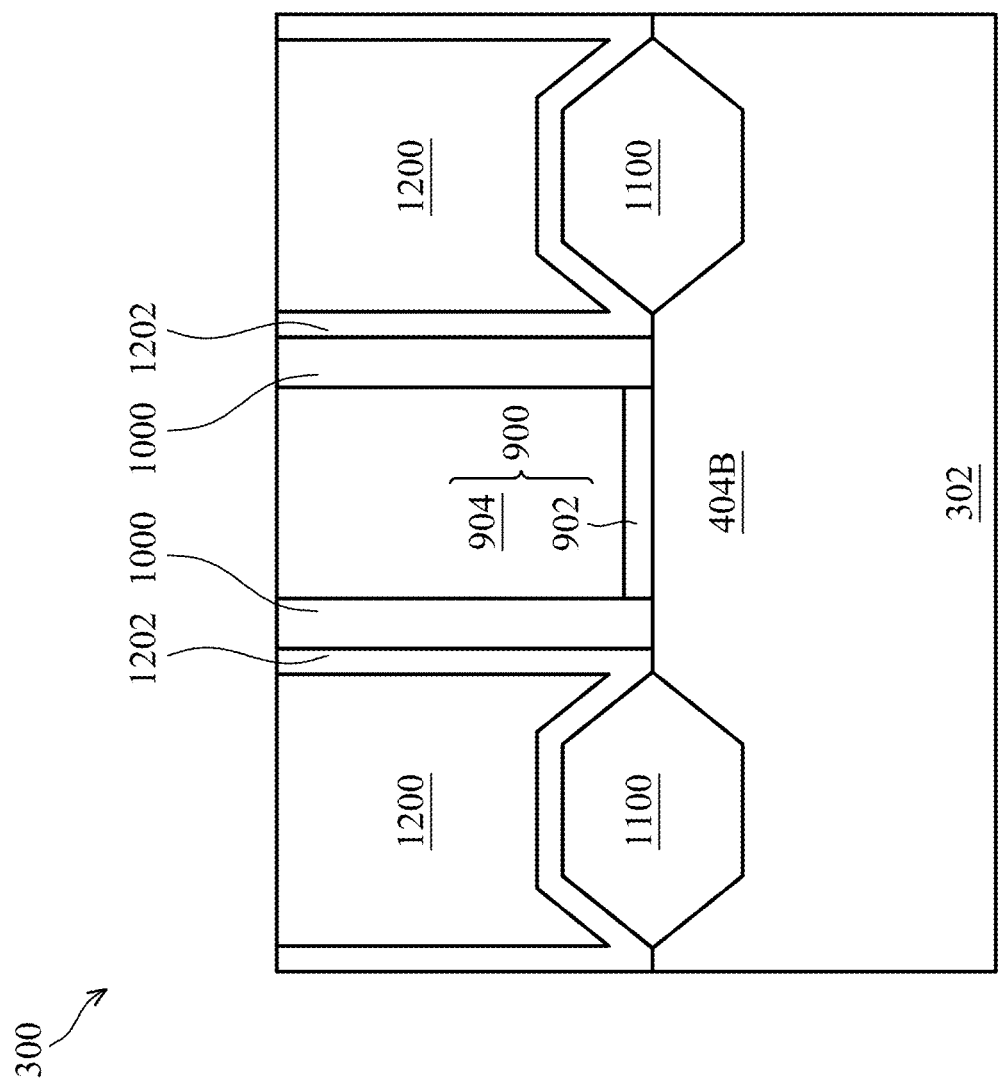

FIGS. 10-12 illustrate the cross-sectional views of further processing (or making) of the FinFET device 300 along cross-section A-A of one of the semiconductor fins 404A-C (as indicated in FIG. 1). As a representative example, one dummy gate structures 900 is illustrated over the semiconductor fin 404B disposed between the dummy fins 500A and 500B in FIGS. 10-12. In some embodiments, the semiconductor fin 400B, which is sandwiched by the dummy fins 500A-B (if formed), will later be "cut" (or otherwise removed) to form a dielectric cut structure that electrically separates transistors having the semiconductor fins 404A and 404C as their respective channels. In various embodiments, at least a portion of the dielectric cut structure has a diamond-like profile, which can help reduce leakage between the separated transistors. Details of the dielectric cut structure will be discussed below. It should be appreciated that more than one dummy gate structure can be formed over the fin 404B (and each of the other fins, e.g., 404A, 404C, 600A-B), while remaining within the scope of the present disclosure.

Corresponding to operation 212 of FIG. 2, FIG. 10 is a cross-sectional view of the FinFET device 300 including gate spacer 1000 formed around (e.g., along and contacting the sidewalls of) the dummy gate structure 900. For example, the gate spacer 1000 may be formed on opposing sidewalls of the dummy gate structure 900. It should be understood that any number of gate spacers can be formed around the dummy gate structure 900 while remaining within the scope of the present disclosure.

The gate spacer 1000 may be a low-k spacer and may be formed of a suitable dielectric material, such as silicon oxide, silicon oxycarbonitride, or the like. Any suitable deposition method, such as thermal oxidation, chemical vapor deposition (CVD), or the like, may be used to form the gate spacer 1000. The shapes and formation methods of the gate spacer 1000 as illustrated in FIG. 10 are merely non-limiting examples, and other shapes and formation methods are possible. These and other variations are fully intended to be included within the scope of the present disclosure.

Corresponding to operation 214 of FIG. 2, FIG. 11 is a cross-sectional view of the FinFET device 300 including a number of source/drain structures 1100 at one of the various stages of fabrication. The source/drain structures 1100 are formed in recesses of the semiconductor fin 404B adjacent to the dummy gate structure 900, e.g., between adjacent dummy gate structures (if multiple dummy gate structures are formed) and/or next to a dummy gate structure. The recesses are formed by, e.g., an anisotropic etching process using the dummy gate structures 900 as an etching mask, in some embodiments, although any other suitable etching process may also be used.

The source/drain structures 1100 are formed by epitaxially growing a semiconductor material in the recess, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof.

As illustrated in FIG. 11, the epitaxial source/drain structures 1100 may have surfaces raised from respective surfaces of the semiconductor fin 404B (e.g. raised above the non-recessed portions of the semiconductor fin 404B) and may have facets. In some embodiments, the source/drain structures 1100 of the adjacent fins may merge to form a continuous epitaxial source/drain structure (not shown). In some embodiments, the source/drain structures 1100 of the adjacent fins may not merge together and remain separate source/drain structures 1100 (not shown). In some embodiments, when the resulting FinFET device is an n-type FinFET, the source/drain structures 1100 can include silicon carbide (SiC), silicon phosphorous (SiP), phosphorous-doped silicon carbon (SiCP), or the like. In some embodiments, when the resulting FinFET device is a p-type FinFET, the source/drain structures 1100 can include SiGe, and a p-type impurity such as boron or indium.

The epitaxial source/drain structures 1100 may be implanted with dopants to form source/drain structures 1100 followed by an annealing process. The implanting process may include forming and patterning masks such as a photoresist to cover the regions of the FinFET device 300 that are to be protected from the implanting process. The source/drain structures 1100 may have an impurity (e.g., dopant) concentration in a range from about $1 \times 10^{19}$ cm$^{-3}$ to about $1 \times 10^{21}$ cm$^{-3}$. P-type impurities, such as boron or indium, may be implanted in the source/drain structures 1100 of a P-type transistor. N-type impurities, such as phosphorous or arsenide, may be implanted in the source/drain structures 1100 of an N-type transistor. In some embodiments, the epitaxial source/drain structures 1100 may be in situ doped during their growth.

Corresponding to operation 216 of FIG. 2, FIG. 12 is a cross-sectional view of the FinFET device 300 including an interlayer dielectric (ILD) 1200 at one of the various stages of fabrication. In some embodiments, prior to forming the ILD 1200, a contact etch stop layer (CESL) 1202 is formed over the structure, as illustrated in FIG. 12. The CESL 1202 can function as an etch stop layer in a subsequent etching process, and may comprise a suitable material such as silicon oxide, silicon nitride, silicon oxynitride, combinations thereof, or the like, and may be formed by a suitable formation method such as CVD, PVD, combinations thereof, or the like.

Next, the ILD 1200 is formed over the CESL 1202 and over the dummy gate structures 900. In some embodiments, the ILD 1200 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. After the ILD 1200 is formed, an optional dielectric layer (not shown) is formed over the ILD 1200. The dielectric layer can function as a protection layer to prevent or reduces the loss of the ILD 1200 in subsequent etching processes. The dielectric layer may be formed of a suitable material, such as silicon nitride, silicon carbonitride, or the like, using a suitable method such as CVD, PECVD, or FCVD. After the dielectric layer is formed, a planarization process, such as a CMP process, may be performed to achieve a level upper surface for the dielectric layer. The CMP may also remove the mask 906 and portions of the CESL 1202 disposed over the dummy gate 904 (FIG. 11). After the planarization process, the upper surface of the dielectric layer is level with the upper surface of the dummy gate 904, in some embodiments.

Figure 13:
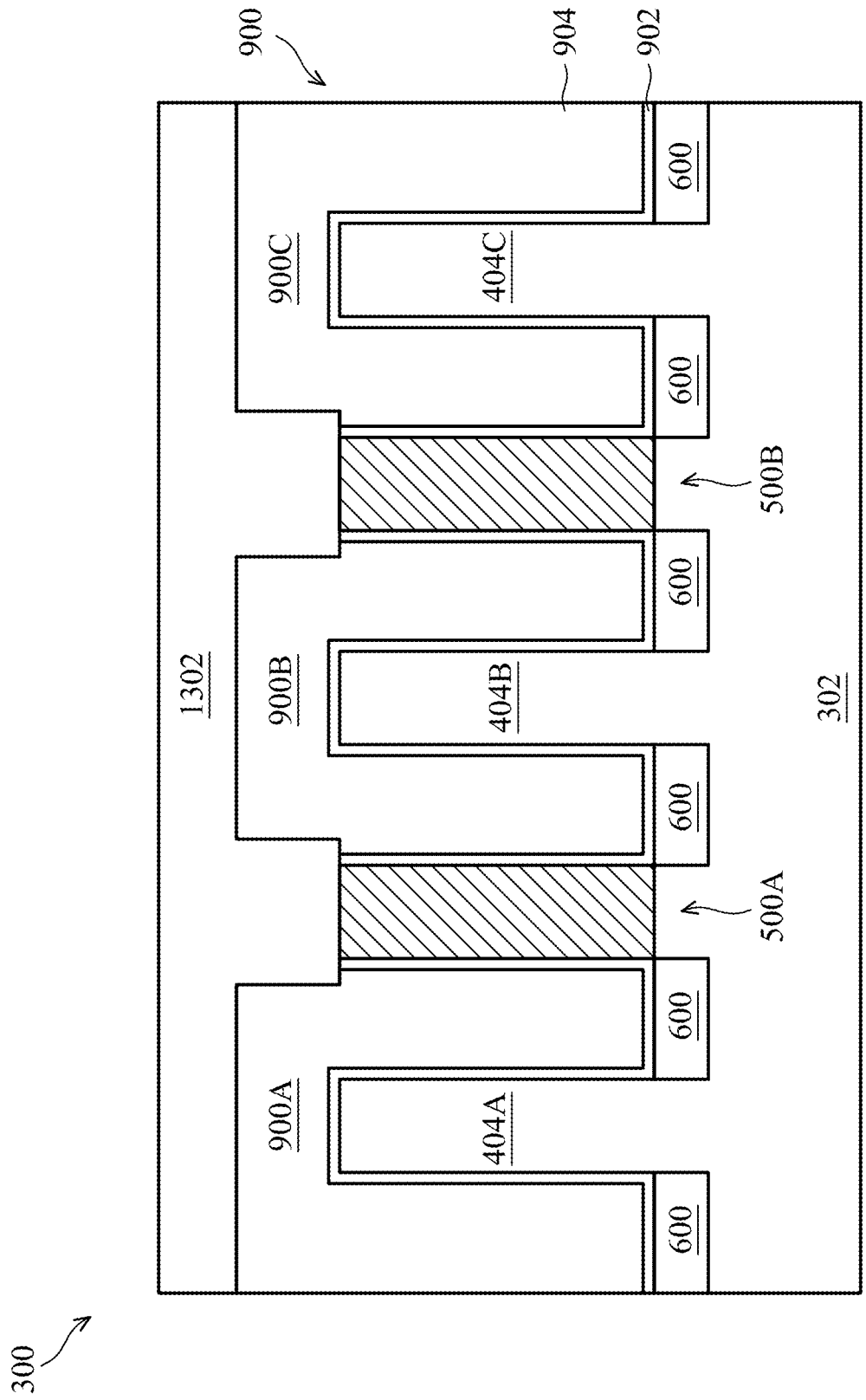

Corresponding to operation 218 of FIG. 2, FIG. 13 is a cross-sectional view of the FinFET device 300 including a dielectric cut structure 1302 at one of the various stages of fabrication, in some embodiments. The cross-sectional view of the FinFET device 300 in FIG. 13 is cut along the lengthwise direction of a gate structure, e.g., cross-section B-B (as indicated in FIG. 1).

The dielectric cut structure 1302 is formed by removing portions of the dummy gate structure 900 that are disposed above the dummy fins 500A-B to form cavities, which are then filled with a dielectric material to form the dielectric cut structure 1302. In some embodiments, a portion of the dielectric material may be formed above the top surface of the remaining dummy gate structure, as shown in FIG. 13. Upon the dielectric cut structure 1302 being formed, the dummy gate structure 900 may be cut into three separate (isolated) dummy gate structures, which are herein referred to as dummy gate structures 900A, 900B, and 900C, respectively. It should be noted that at this stage of fabrication, the dielectric cut structure 1302 may not be completed yet. For example, the dielectric cut structure 1302 can be further extended by removing the dummy gate structure 900B and semiconductor fin 404B, which will be discussed in further detail below.

To form the dielectric cut structure 1302, a mask may be formed over the dummy gate structure 900 to expose the portions of the dummy gate 904 desired to be removed (e.g., the portions disposed over the dummy fins 500A-B), followed by at least one anisotropic or isotropic etching processes to remove the portions of the dummy gate 904 and the underlying dummy gate dielectric 902. During the removal of the dummy gate and dummy gate dielectric, the dummy fins 500A-B may each function as an etch stop layer. For example, once the top surfaces of the dummy fins 500A-B are exposed (by the cavities), the etching process may stop. In various embodiments, the etching process is performed using an etchant that is selective to the material of the dummy gate structure 900 with respect to the dummy fins 500A-B (e.g., having a higher etching rate for the dummy gate structure 900 than the dummy fins 500A-B). Next, the cavities are filled with a dielectric material to form the dielectric cut structure 1302. The dielectric material may be, for example, silicon oxide, silicon nitride, silicon oxynitride, silicon carbide, silicon carbonitride, silicon oxycarbonitride, silicon oxycarbide, multilayers thereof, or the like. The dielectric cut structure 1302 can be formed by depositing the dielectric material in the cavities using any suitable method, such as CVD, PECVD, or FCVD. After the deposition, a CMP may be performed to remove any excess dielectric material from the dielectric cut structure 1302.

Figure 14:
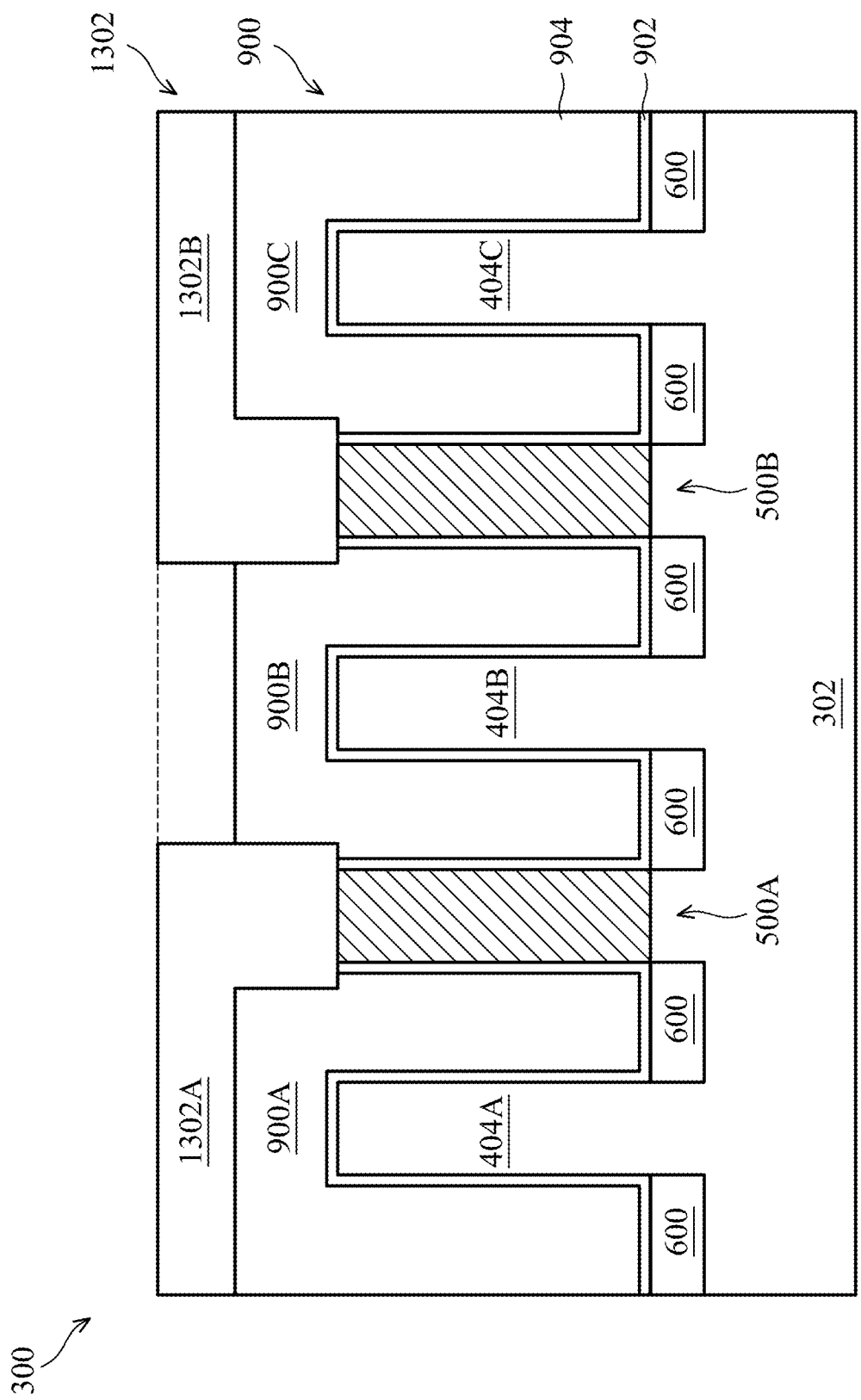

Corresponding to operation 220 of FIG. 2, FIG. 14 is a cross-sectional view of the FinFET device 300 in which a portion of the dielectric cut structure 1302 is removed at one of the various stages of fabrication, in some embodiments. The cross-sectional view of the FinFET device 300 in FIG. 3 is cut along the lengthwise direction of a gate structure, e.g., cross-section B-B (as indicated in FIG. 1).

In some embodiments, the removed portion of the dielectric cut structure 1302 (shown in a dotted line in FIG. 14) is aligned with the dummy gate structure 900B. Alternatively stated, such a removed portion is sandwiched by two remaining portions of the dielectric cut structure, 1302A and 1302B. Upon removing the portion of the dielectric cut structure 1302, a top surface of the dummy gate structure 900B can be exposed, which allows subsequent processes to extend the dielectric cut structure 1302.

Figure 15A:
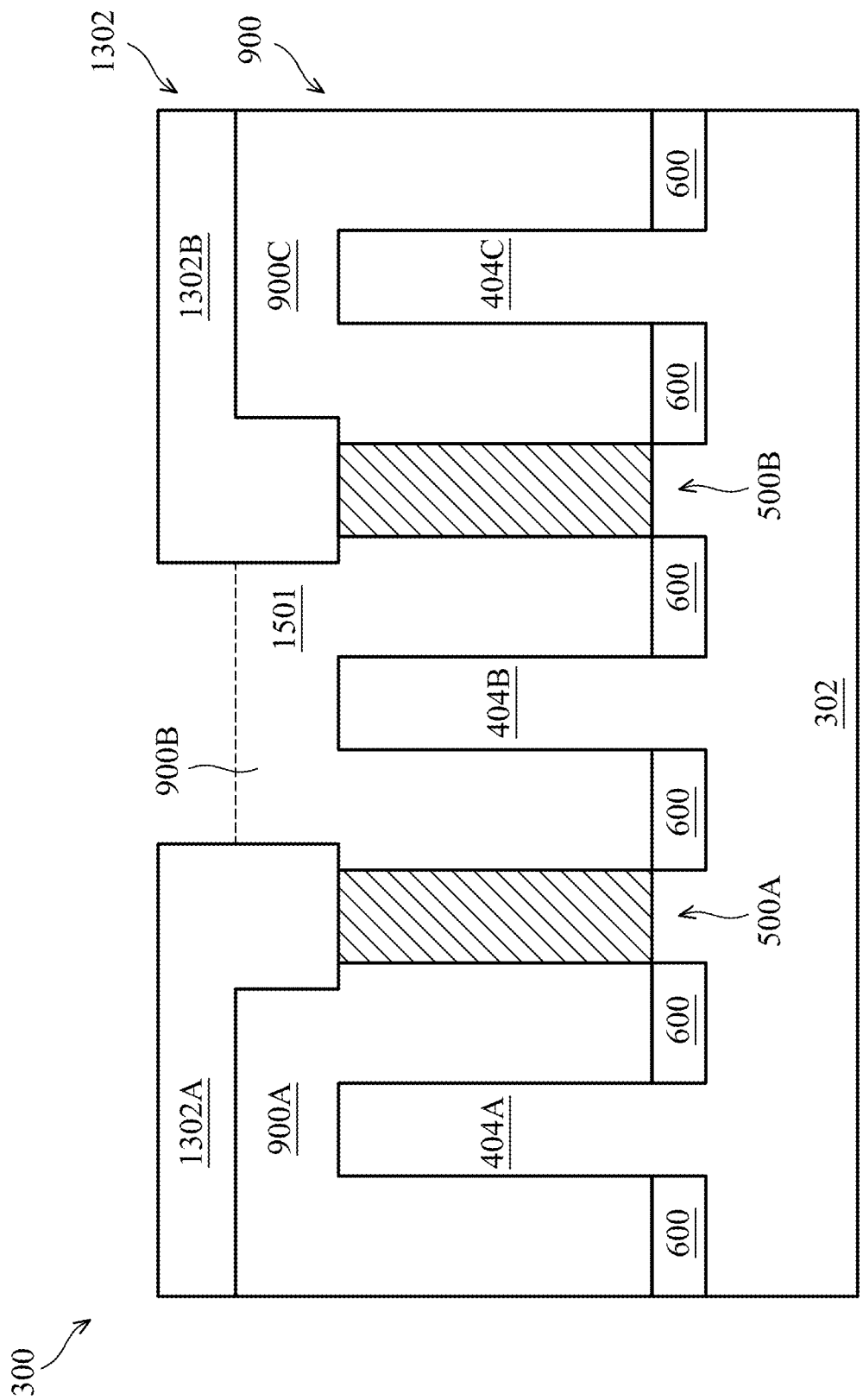
Figure 15B:
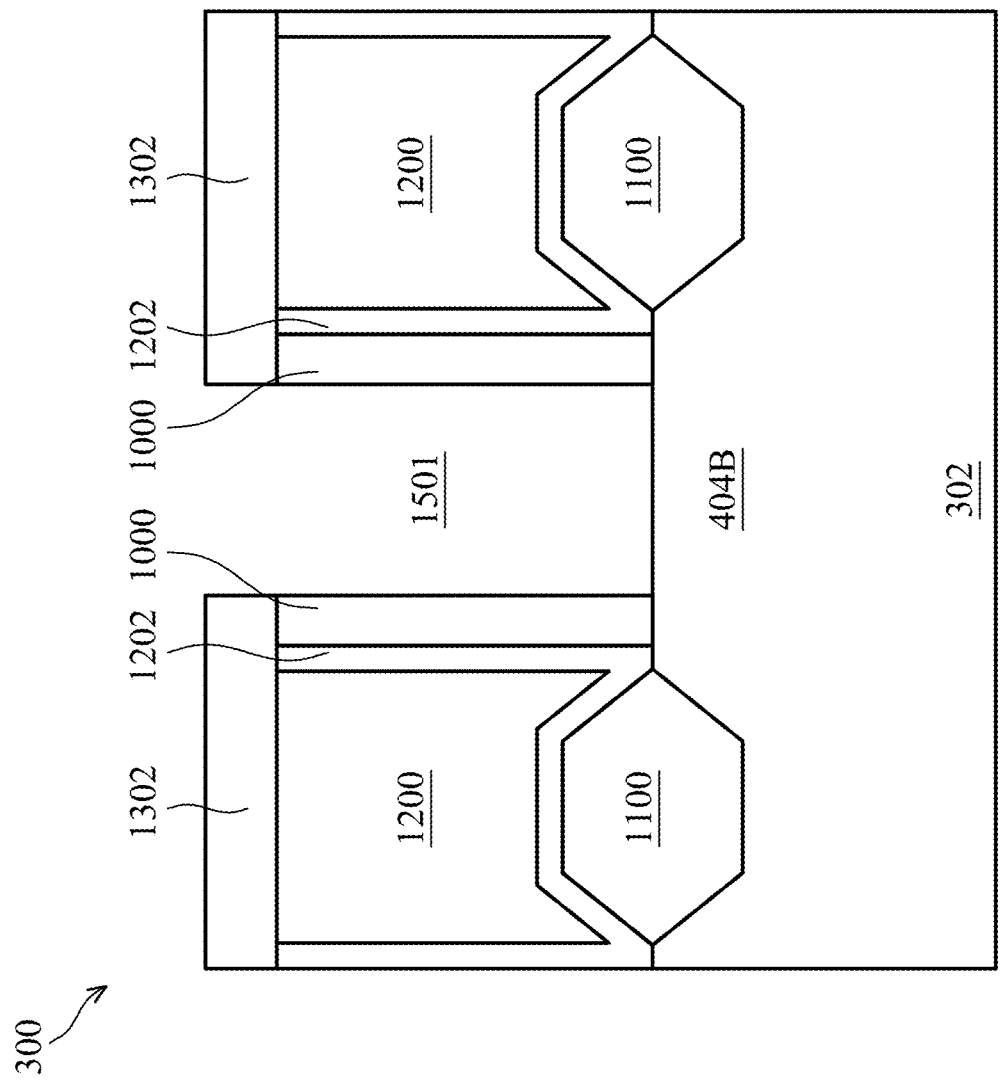

Corresponding to operation 222 of FIG. 2, FIG. 15A is a cross-sectional view of the FinFET device 300 in which the dummy gate structure 900B (shown in a dotted line in FIG. 15A) is removed at one of the various stages of fabrication, in some embodiments. The cross-sectional view of the FinFET device 300 in FIG. 15A is cut along the lengthwise direction of a gate structure, e.g., cross-section B-B (as indicated in FIG. 1). Corresponding to the same operation, illustrated in FIG. 15B is a cross-sectional view of the FinFET device 300 cut along the lengthwise direction of the semiconductor fin 404B, e.g., cross-section A-A (as indicated in FIG. 1).

To remove the dummy gate structure 900B, at least one anisotropic or isotropic etching process may be performed. During the removal of the dummy gate structure 900B, the dummy fins 500A-B may be again used as an etch stop layer. Consequently, in addition to exposing the semiconductor fin 404B, one of the sidewalls of each of the dummy fins 500A-B may be exposed. The etching process is performed using an etchant that is selective to the material of the dummy gate structure 900 with respect to the dummy fins 500A-B, semiconductor fin 404B, and STI 600 (e.g., having a higher etching rate for the dummy gate structure 900 than the dummy fins 500A-B, semiconductor fin 404B, and STI 600). Along the other cross-section (as shown in FIG. 15B), the gate spacer 1000 may protect the source/drain structures 1100 from being damaged, while removing the dummy gate structure 900B.

Upon the semiconductor fin 404B being exposed (e.g., by removing the dummy gates structure 900B), a cavity 1501, which is between the dummy fins 500A-B (if previously formed), is formed. Next, a number of etching processes are performed to remove the semiconductor fin 404B to extend the cavity 1501. In various embodiments, each of the etching processes is configured to provide a combination of isotropic etching and anisotropic etching, which can cause a portion of the cavity 1501 to have a diamond-like profile formed over a portion of the top surface of the substrate 302, e.g., between the neighboring STIs 600 (that sandwiched the semiconductor fin 404B) and extending into the substrate 302. Such a cavity can later be filled with a dielectric material, similar as the material of the dielectric cut structure 1302, to extend the dielectric cut structure 1302. By forming a portion of the dielectric cut structure 1302 in the diamond-like profile, any residual material (e.g., silicon) that is present along sidewalls of the STIs 600 (sometimes referred to as a silicon horn) by using existing technologies can be advantageously removed. As such, the dielectric cut structure 1302 can minimize or eliminate any leakage that may be induced by the residual material. These etching processes will be discussed in further detail below with respect to FIGS. 16A-B, 17A-B, and 18A-B, respectively.

Figure 16A:
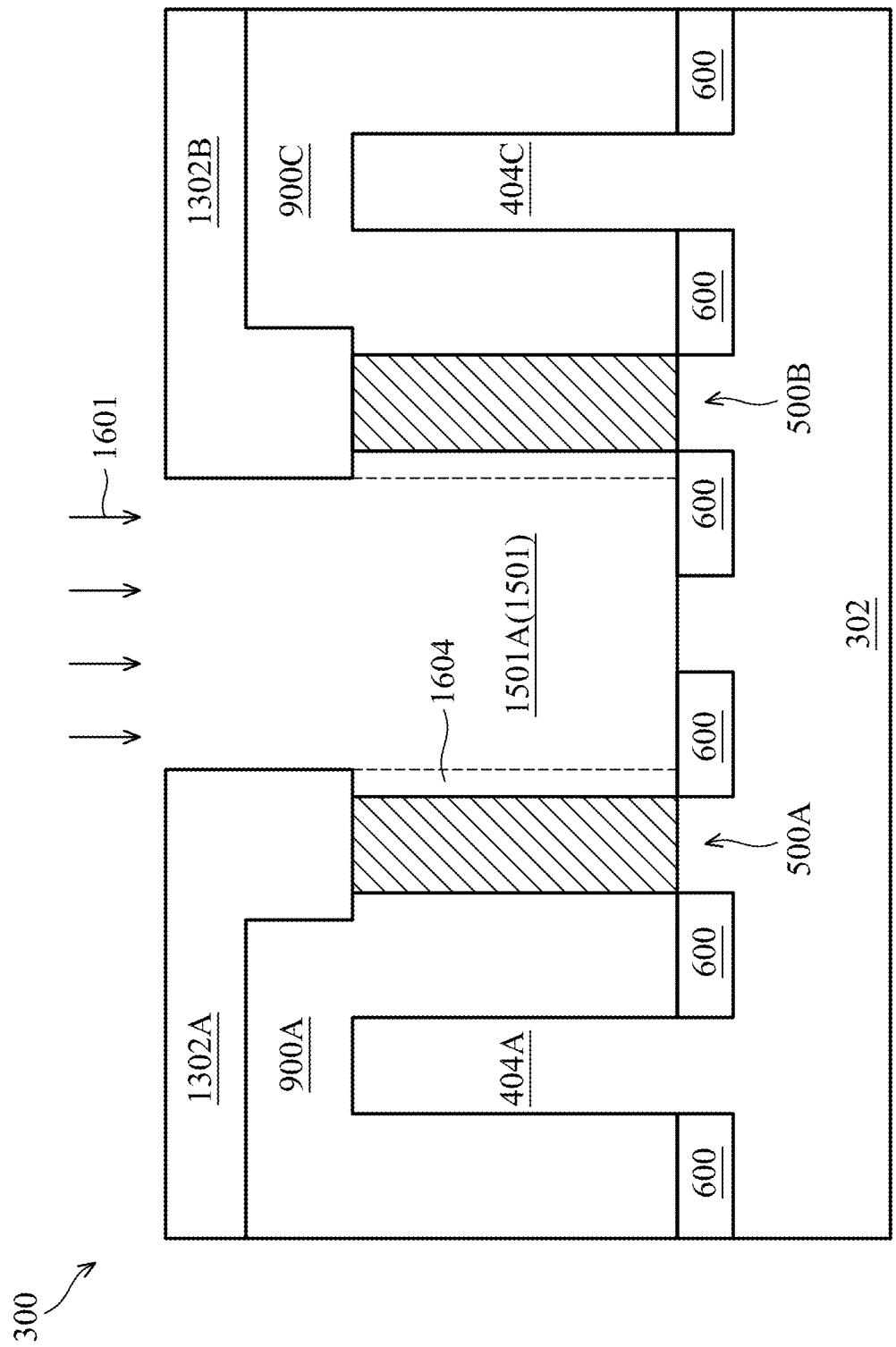
Figure 16B:
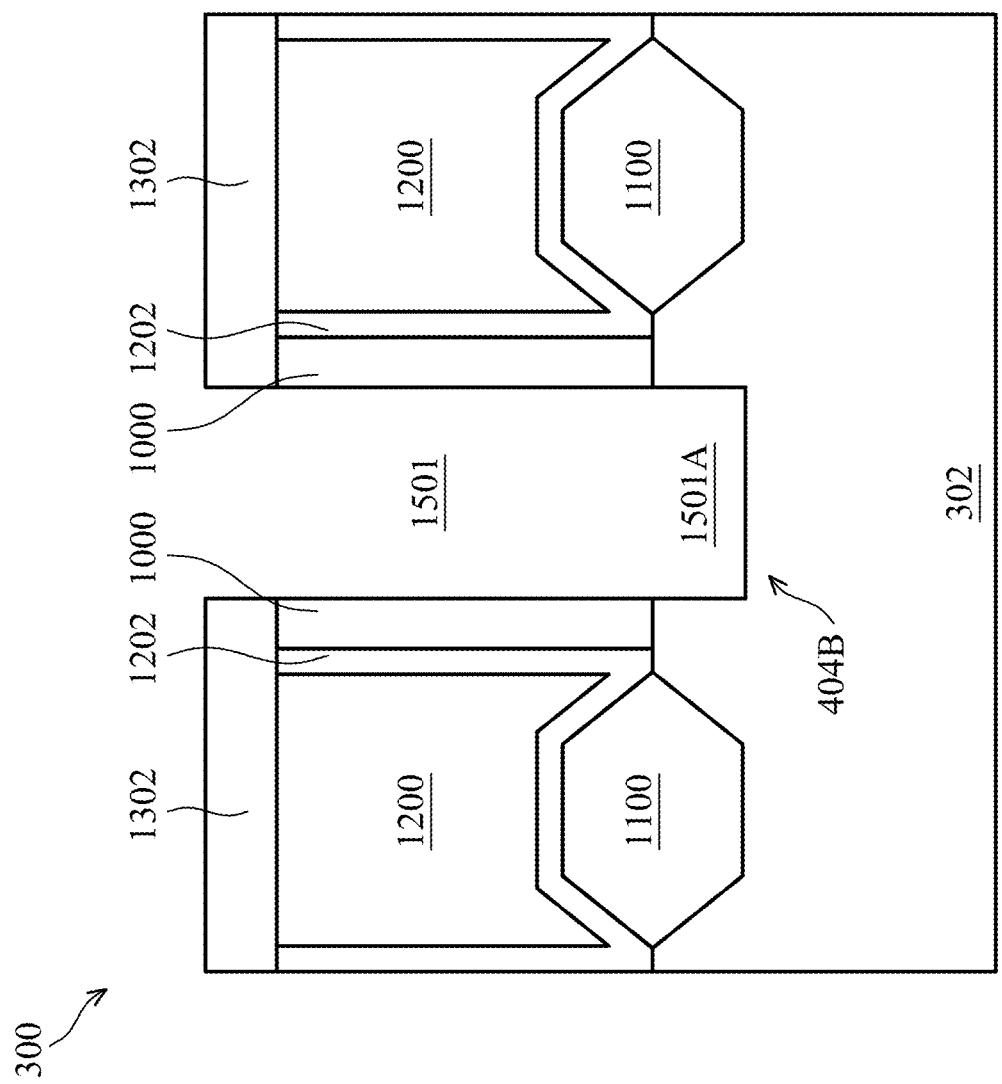

Corresponding to operation 224 of FIG. 2, FIG. 16A is a cross-sectional view of the FinFET device 300 in which an upper portion of the semiconductor fin 404B is removed at one of the various stages of fabrication, in some embodiments. The cross-sectional view of the FinFET device 300 in FIG. 16A is cut along the lengthwise direction of a gate structure, e.g., cross-section B-B (as indicated in FIG. 1). Corresponding to the same operation, illustrated in FIG. 16B is a cross-sectional view of the FinFET device 300 cut along the lengthwise direction of the semiconductor fin 404B, e.g., cross-section A-A (as indicated in FIG. 1).

Upon exposing the semiconductor fin 404B (FIGS. 15A-B), a first etching process 1601 is performed to remove the upper portion of the semiconductor fin 404B, thereby extending the cavity 1501 (or forming a first portion of the cavity 1501A). Specifically, the first etching process 1601 can remove the portion of the semiconductor fin 404B that is disposed above the STIs 600 and above a bottom surface of the source/drain structures 1100, as illustrated in FIGS. 16A-B, respectively. Alternatively stated, the first etching process 1601 may stop when an intermediate surface of the semiconductor fin 404B that is aligned with the top surface of the STIs 600 is exposed. During the first etching process 1601, the optionally formed dummy fins 500A-B may protect the semiconductor fins 404A-B. In some embodiments, the first etching process 1601 includes a combination of isotropic etching and anisotropic etching. Further, the first etching process 1601 may optionally include one or more passivation gases to form a protection layer 1604 (e.g., $SiO_2$) over one of the sidewalls of each of the dummy fins 500A-B.

For example, the etching process 1601 can include a plasma etching process. In such a plasma etching process (including radical plasma etching, remote plasma etching, and other suitable plasma etching processes), gas sources such as chlorine ($Cl_2$), hydrogen bromide (HBr), carbon tetrafluoride ($CF_4$), fluoroform ($CHF_3$), difluoromethane ($CH_2F_2$), fluoromethane ($CH_3F$), hexafluoro-1,3-butadiene ($C_4F_6$), boron trichloride ($BCl_3$), sulfur hexafluoride ($SF_6$), hydrogen ($H_2$), nitrogen trifluoride ($NF_3$), and other suitable gas sources and combinations thereof can be used with passivation gases such as nitrogen ($N_2$), oxygen ($O_2$), carbon dioxide ($CO_2$), sulfur dioxide ($SO_2$), carbon monoxide (CO), methane ($CH_4$), silicon tetrachloride ($SiCl_4$), and other suitable passivation gases and combinations thereof. Moreover, for the plasma etching process, the gas sources and/or the passivation gases can be diluted with gases such as argon (Ar), helium (He), neon (Ne), and other suitable dilutive gases and combinations thereof.

As a non-limiting example, in the first etching process 1601, a source power (e.g., ranging from about 400 watts to about 800 watts) and a bias power (e.g., ranging from about 0 watts to 800 watts) may be applied, under a pressure of 1 millitorr to 5 torr and an etch gas flow of 0 standard cubic centimeters per minute to 5000 standard cubic centimeters per minute. The bias power may be applied comparable with the source power, in various embodiments. As such, the first etching process 1601 may present a higher amount/extent of the anisotropic etching than isotropic etching. However, it is noted that source powers, bias powers, pressures, and flow rates outside of these ranges can also be contemplated, while remaining within the scope of the present disclosure.

Figure 17A:
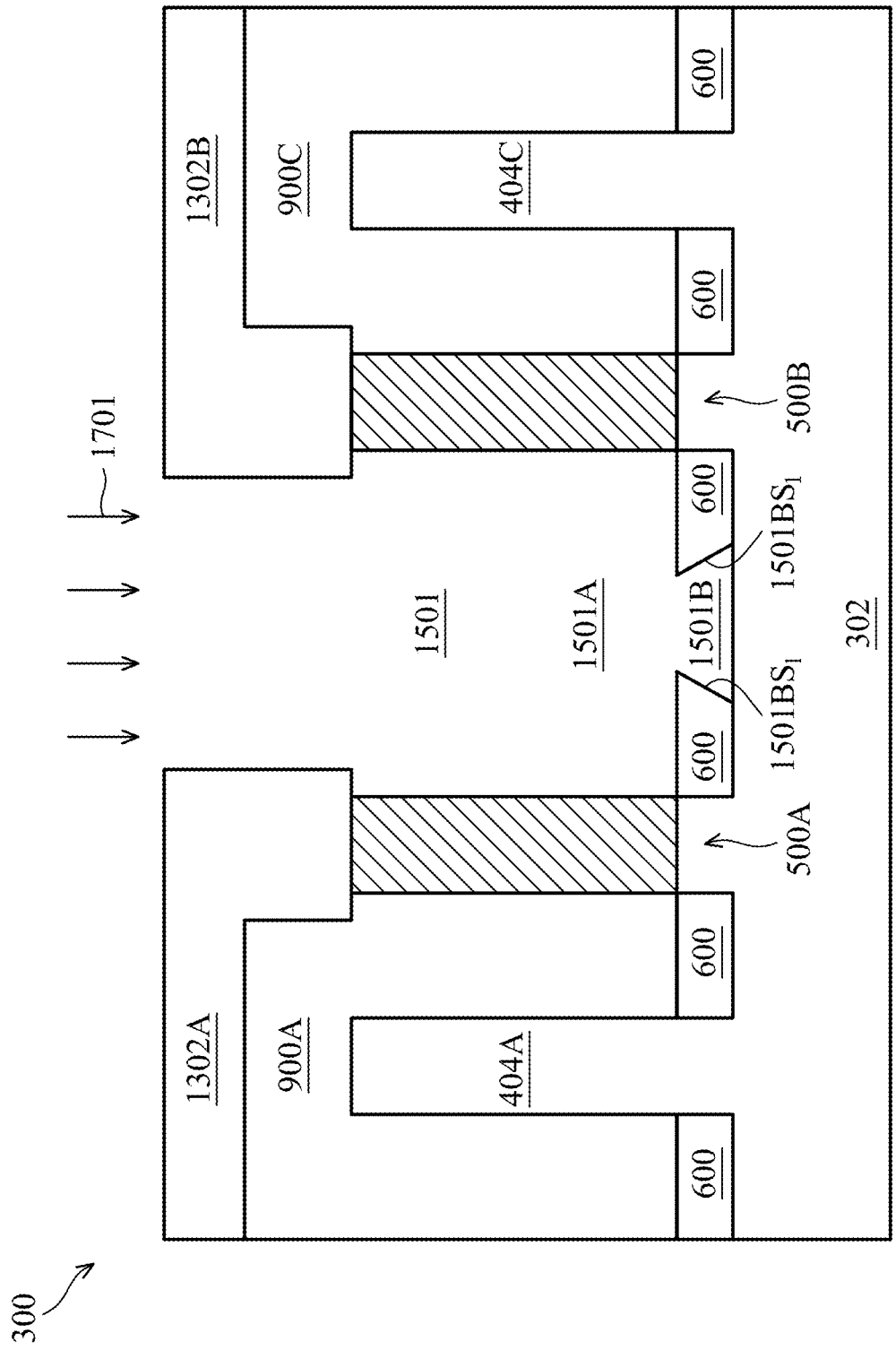
Figure 17B:
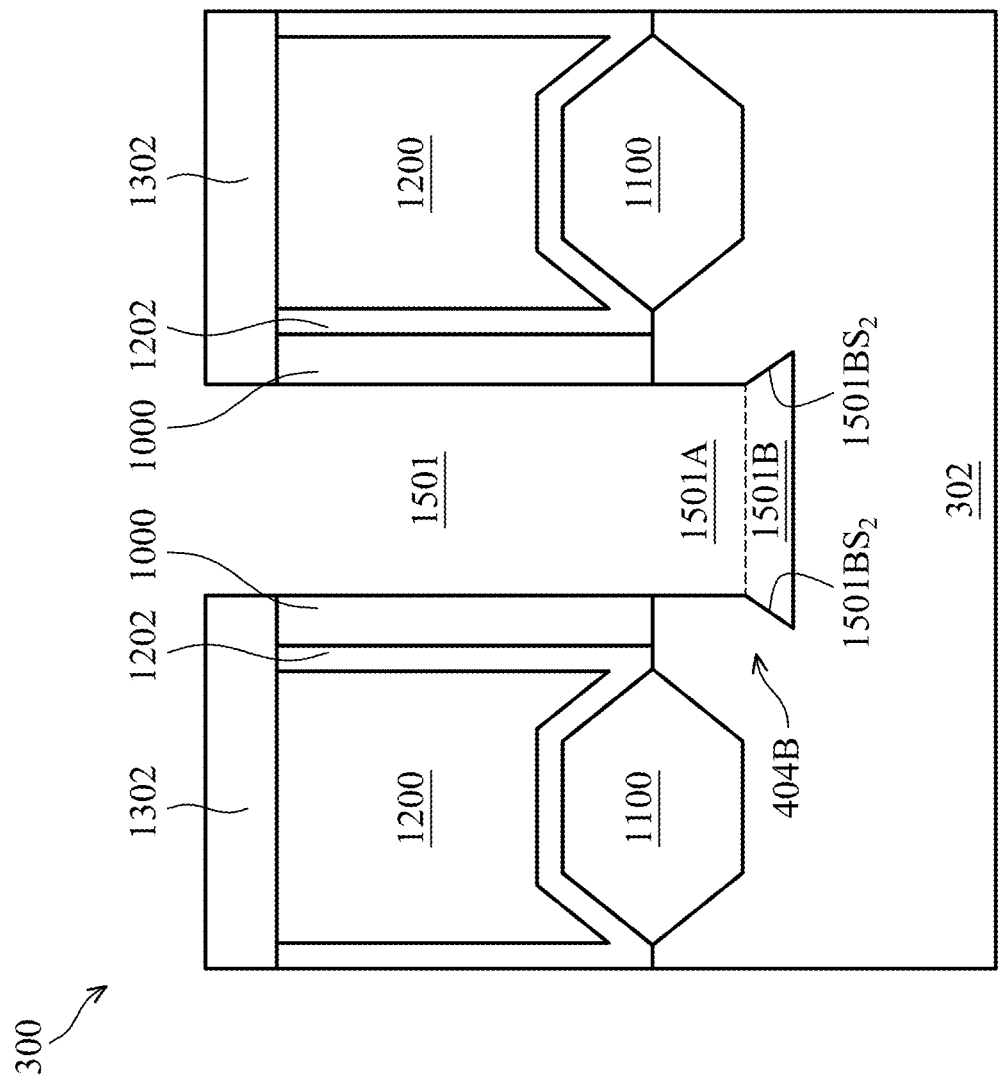

Corresponding to operation 226 of FIG. 2, FIG. 17A is a cross-sectional view of the FinFET device 300 in which a lower portion of the semiconductor fin 404B is removed at one of the various stages of fabrication, in some embodiments. The cross-sectional view of the FinFET device 300 in FIG. 17A is cut along the lengthwise direction of a gate structure, e.g., cross-section B-B (as indicated in FIG. 1). Corresponding to the same operation, illustrated in FIG. 17B is a cross-sectional view of the FinFET device 300 cut along the lengthwise direction of the semiconductor fin 404B, e.g., cross-section A-A (as indicated in FIG. 1).

Upon removing the upper portion of the semiconductor fin 404B (FIGS. 16A-B), a second etching process 1701 is performed to remove the lower portion of the semiconductor fin 404B, thereby further extending the cavity 1501 (or forming a second portion of the cavity 1501B). Specifically, the second etching process 1701 can remove the portion of the semiconductor fin 404B that is surrounded by the STIs 600 and respective sidewall portions of those STIs 600, as illustrated in FIG. 17A. The second etching process 1701 can remove the portion of the semiconductor fin 404B that is below the bottom surface of the source/drain structures 1100, as illustrated in FIG. 17B. In some embodiments, the second etching process 1701 includes a combination of isotropic etching and anisotropic etching, with a higher amount/extent of the isotropic (e.g., lateral) etching than the anisotropic (e.g., vertical) etching. By controlling the ratio of isotropic etching to the anisotropic etching, the second portion of the cavity 1501B can have tilted sidewalls 1501BS$_1$ and 1501BS$_2$, as illustrated in FIG. 17A-B, respectively. Specifically in FIG. 17A, the sidewalls 1501BS$_1$ face each other along the lengthwise direction of the dummy gate structure (900A, 900C), with a spacing that separates the sidewalls 1501BS$_1$ increased along a vertical direction toward the substrate 302; and in FIG. 17B, the sidewalls 1501BS$_2$ face each other along the lengthwise direction of the semiconductor fin 404B, with a spacing that separates the sidewalls 1501BS$_2$ increased along the vertical direction toward the substrate 302.

For example, the etching process 1701 can include a plasma etching process. In such a plasma etching process (including radical plasma etching, remote plasma etching, and other suitable plasma etching processes), gas sources such as chlorine ($Cl_2$), hydrogen bromide (HBr), carbon tetrafluoride ($CF_4$), fluoroform ($CHF_3$), difluoromethane ($CH_2F_2$), fluoromethane ($CH_3F$), hexafluoro-1,3-butadiene ($C_4F_6$), boron trichloride ($BCl_3$), sulfur hexafluoride ($SF_6$), hydrogen ($H_2$), nitrogen trifluoride ($NF_3$), and other suitable gas sources and combinations thereof can be used with passivation gases such as nitrogen ($N_2$), oxygen ($O_2$), carbon dioxide ($CO_2$), sulfur dioxide ($SO_2$), carbon monoxide (CO), methane ($CH_4$), silicon tetrachloride ($SiCl_4$), and other suitable passivation gases and combinations thereof. Moreover, for the plasma etching process, the gas sources and/or the passivation gases can be diluted with gases such as argon (Ar), helium (He), neon (Ne), and other suitable dilutive gases and combinations thereof.

As a non-limiting example, in the second etching process 1701, a source power (e.g., ranging from about 1000 watts to about 2000 watts) and a bias power (e.g., ranging from about 500 watts to 800 watts) may be applied, under a pressure of 1 millitorr to 5 torr and an etch gas flow of 0 standard cubic centimeters per minute to 5000 standard cubic centimeters per minute. The source power may be applied higher than the bias power, in various embodiments. As such, the second etching process 1701 may present a higher amount/extent of the isotropic etching than anisotropic etching. However, it is noted that source powers, bias powers, pressures, and flow rates outside of these ranges can also be contemplated, while remaining within the scope of the present disclosure.

Figure 18A:
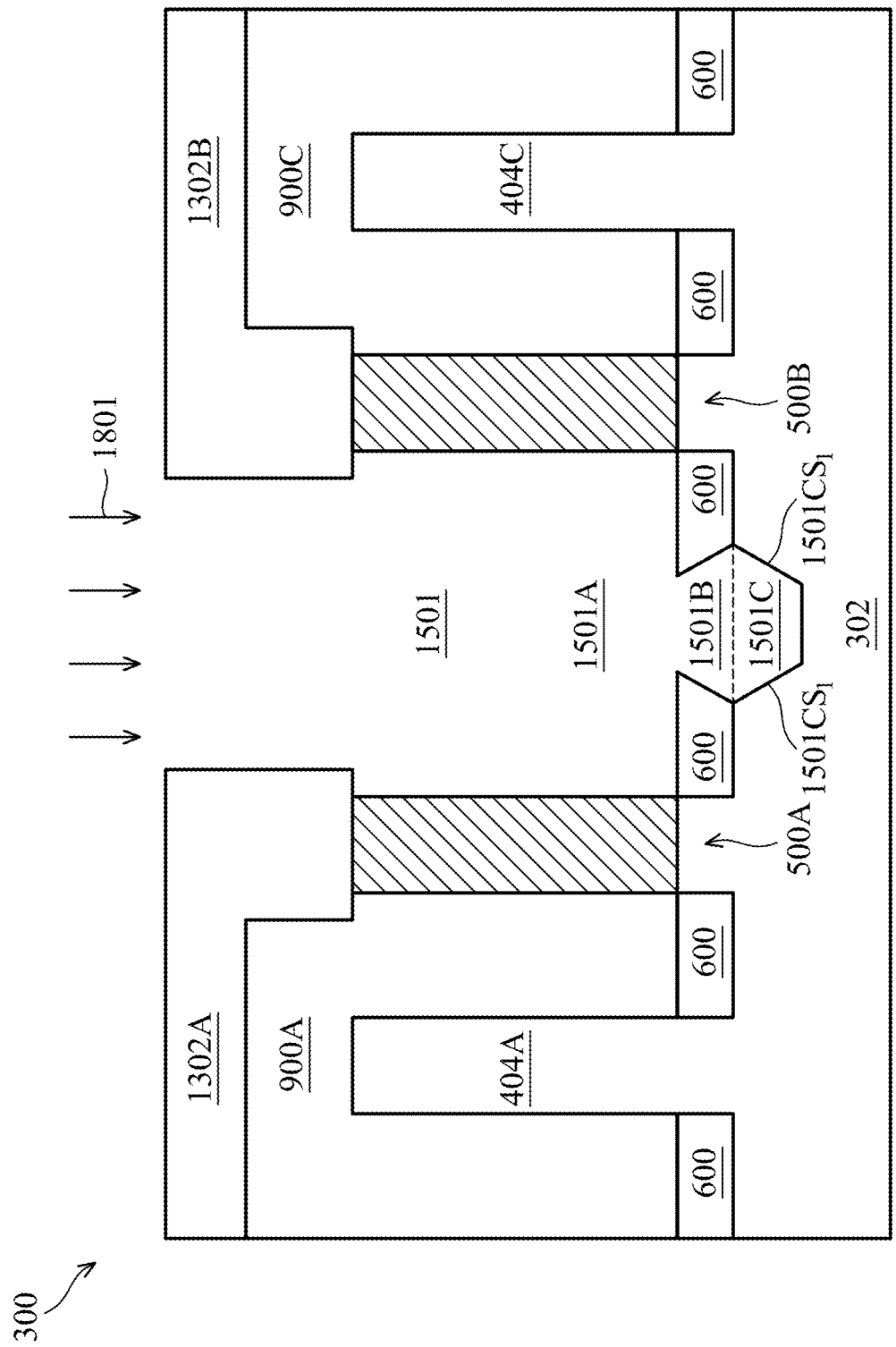
Figure 18B:
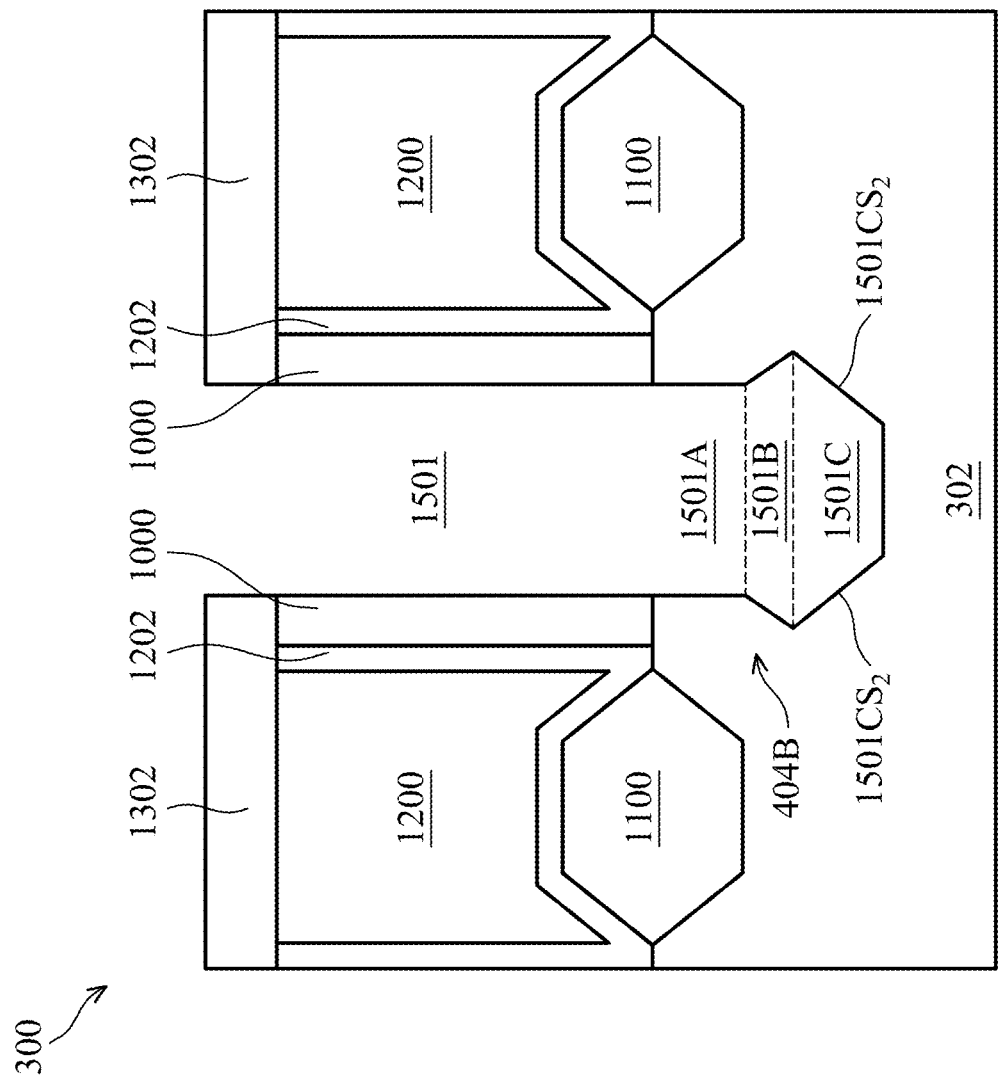

Corresponding to operation 228 of FIG. 2, FIG. 18A is a cross-sectional view of the FinFET device 300 in which an upper portion of the substrate 302 is removed at one of the various stages of fabrication, in some embodiments. The cross-sectional view of the FinFET device 300 in FIG. 18A is cut along the lengthwise direction of a gate structure, e.g., cross-section B-B (as indicated in FIG. 1). Corresponding to the same operation, illustrated in FIG. 18B is a cross-sectional view of the FinFET device 300 cut along the lengthwise direction of the semiconductor fin 404B, e.g., cross-section A-A (as indicated in FIG. 1).

Upon removing the lower portion of the semiconductor fin 404B (FIGS. 17A-B), a third etching process 1801 is performed to remove the upper portion of the substrate 302, thereby further extending the cavity 1501 (or forming a third portion of the cavity 1501C). Specifically, the third etching process 1801 can remove the upper portion of the substrate 302 that is below the STIs 600, as illustrated in FIG. 18A. In some embodiments, the third etching process 1801 includes a combination of isotropic etching and anisotropic etching, with a lower amount/extent of the isotropic (e.g., lateral) etching than the anisotropic (e.g., vertical) etching. As such, the third portion of the cavity 1501C can have tilted sidewalls 1501CS$_1$ and 1501BCS$_2$, as illustrated in FIG. 18A-B, respectively. Specifically in FIG. 18A, the sidewalls 1501CS$_1$ face each other along the lengthwise direction of the dummy gate structure (900A, 900C), with a spacing that separates the sidewalls 1501CS$_1$ decreased along a vertical direction toward the substrate 302; and in FIG. 18B, the sidewalls 1501CS$_2$ face each other along the lengthwise direction of the (removed) semiconductor fin 404B, with a spacing that separates the sidewalls 1501CS$_2$ decreased along the vertical direction toward the substrate 302.

For example, the etching process 1801 can include a plasma etching process. In such a plasma etching process (including radical plasma etching, remote plasma etching, and other suitable plasma etching processes), gas sources such as chlorine ($Cl_2$), hydrogen bromide (HBr), carbon tetrafluoride ($CF_4$), fluoroform ($CHF_3$), difluoromethane ($CH_2F_2$), fluoromethane ($CH_3F$), hexafluoro-1,3-butadiene ($C_4F_6$), boron trichloride ($BCl_3$), sulfur hexafluoride ($SF_6$), hydrogen ($H_2$), nitrogen trifluoride ($NF_3$), and other suitable gas sources and combinations thereof can be used with passivation gases such as nitrogen ($N_2$), oxygen ($O_2$), carbon dioxide ($CO_2$), sulfur dioxide ($SO_2$), carbon monoxide (CO), methane ($CH_4$), silicon tetrachloride ($SiCl_4$), and other suitable passivation gases and combinations thereof. Moreover, for the plasma etching process, the gas sources and/or the passivation gases can be diluted with gases such as argon (Ar), helium (He), neon (Ne), and other suitable dilutive gases and combinations thereof.

As a non-limiting example, in the third etching process 1801, a source power (e.g., ranging from about 1000 watts to about 2000 watts) and a bias power (e.g., ranging from about 500 watts to 800 watts) may be applied, under a pressure of 1 millitorr to 5 torr and an etch gas flow of 0 standard cubic centimeters per minute to 5000 standard cubic centimeters per minute. The source power may be applied lower than or comparable with the bias power, in various embodiments. As such, the third etching process 1801 may present a lower amount/extent of the isotropic etching than anisotropic etching. However, it is noted that source powers, bias powers, pressures, and flow rates outside of these ranges can also be contemplated, while remaining within the scope of the present disclosure.

Figure 19A:
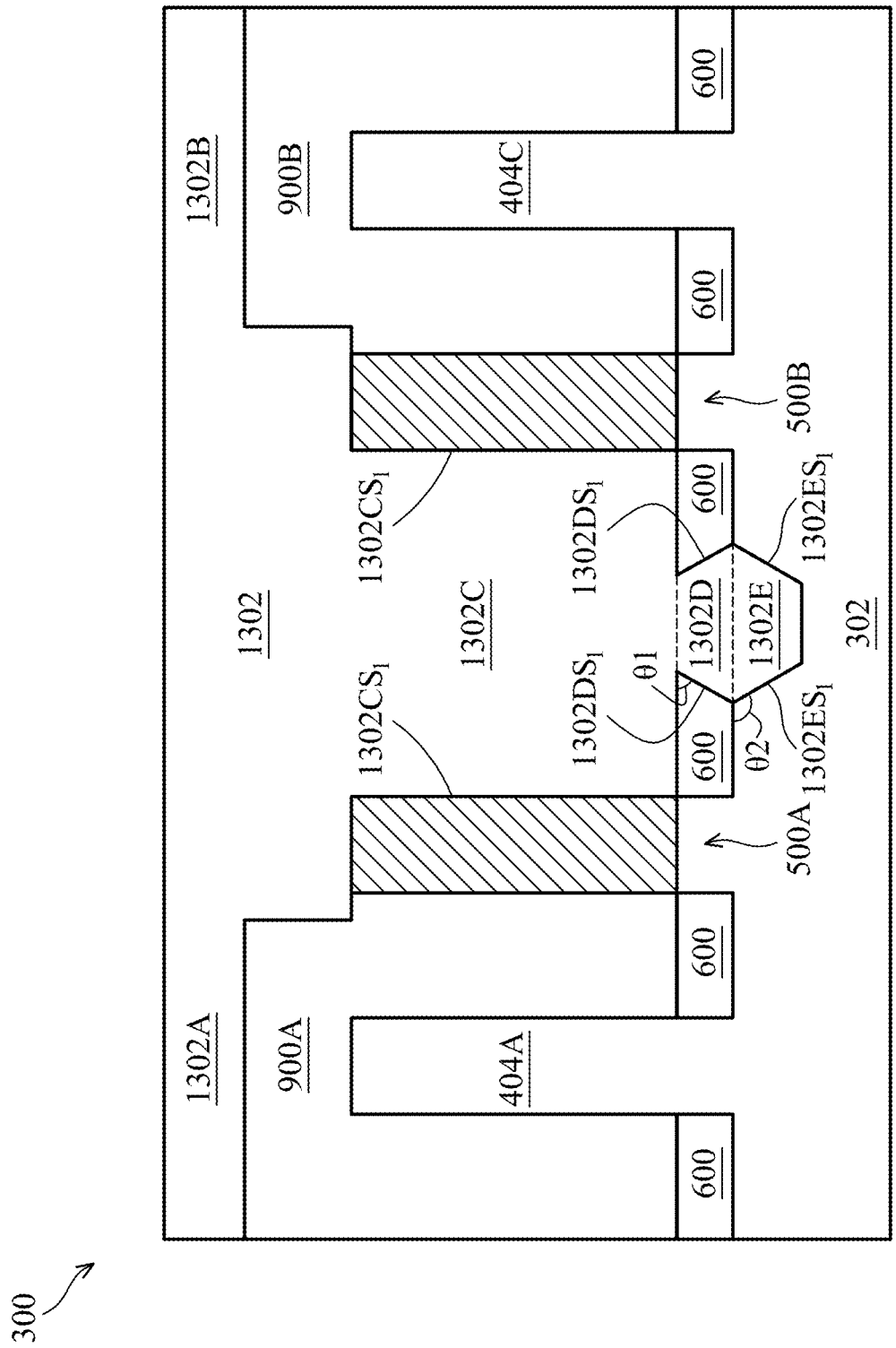
Figure 19B:
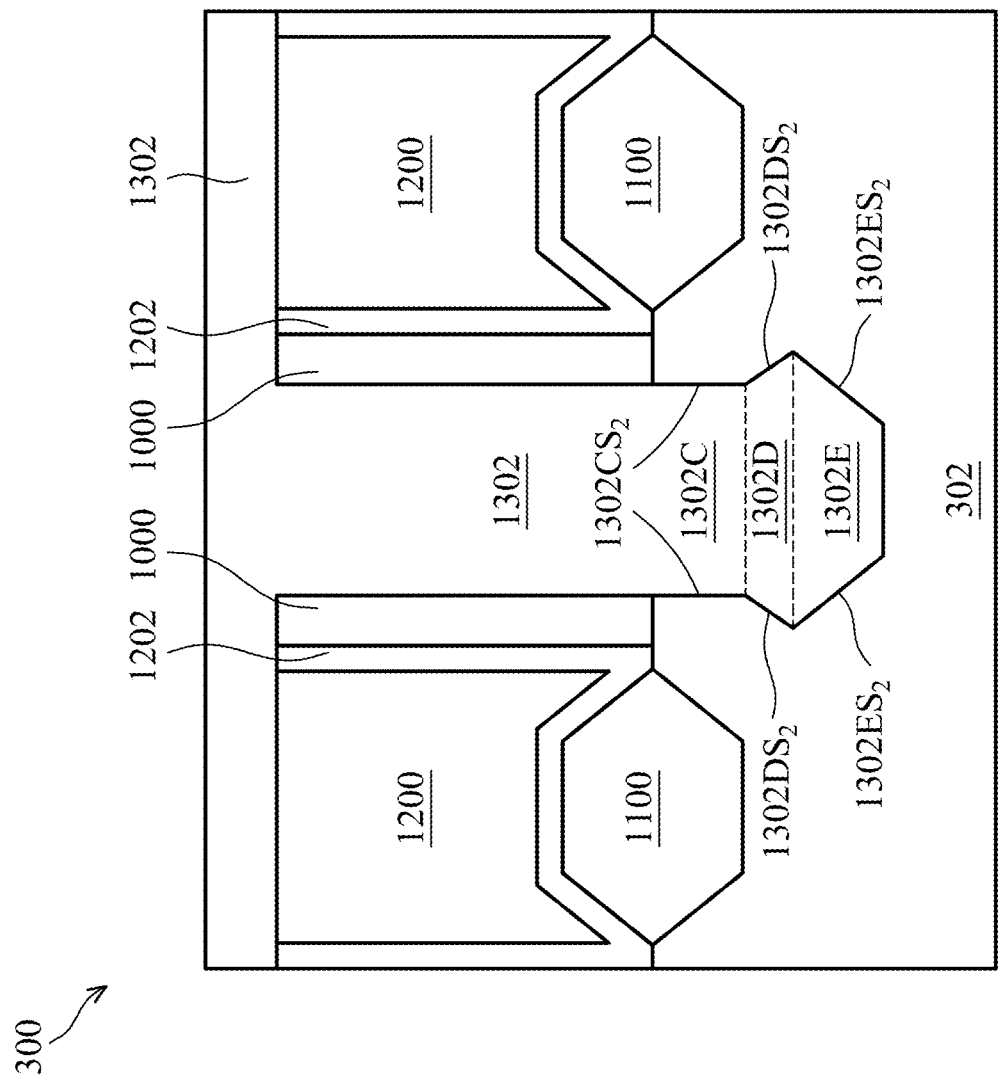

Corresponding to operation 230 of FIG. 2, FIG. 19A is a cross-sectional view of the FinFET device 300 in which the cavity 1501 is filled with a dielectric material at one of the various stages of fabrication, in some embodiments. The cross-sectional view of the FinFET device 300 in FIG. 19A is cut along the lengthwise direction of a gate structure, e.g., cross-section B-B (as indicated in FIG. 1). Corresponding to the same operation, illustrated in FIG. 19B is a cross-sectional view of the FinFET device 300 cut along the lengthwise direction of the semiconductor fin 404B, e.g., cross-section A-A (as indicated in FIG. 1).

In various embodiments, the cavity 1501, with the extended portions 1501A-C, is filled with a dielectric material that is similar as the material of the dielectric cut structure 1302. For example, the dielectric material may be, for example, silicon oxide, silicon nitride, silicon oxynitride, silicon carbide, silicon carbonitride, silicon oxycarbonitride, silicon oxycarbide, multilayers thereof, or the like. As such, the separated portions of the dielectric cut structure 1302A and 1302B may merge again by extended portions 1302C, 1302D, and 1302E (of the dielectric cut structure 1302) that fill the cavity portions 1501A, 1501B, and 1501C (FIGS. 18A-C), respectively.

Specifically, the extended portions 1302C-E can inherit the profiles and dimensions of cavity portions 1501A-C, respectively. For example in FIG. 19A (along the lengthwise direction of the dummy gate structure (900A, 900C)), the portion 1302C can have almost vertical sidewalls $1302CS_1$ extending along the sidewalls of the dummy fins 500A-B, respectively; the portion 1302D can have tilted sidewalls $1302DS_1$ that face each other and are separated by an increasing spacing (when running along the direction extending toward the substrate 302); and the portion 1302E can have tilted sidewalls $1302ES_1$ that face each other and are separated by an decreasing spacing (when running along the direction extending toward the substrate 302). Further, as shown in FIG. 19A, each of the sidewalls $1302DS_1$ and the top surface of the STIs 600 can form an acute angle $\theta_1$; and each of the sidewalls $1302ES_1$ and the bottom surface of the STIs 600 can form an obtuse angle $\theta_2$.

As a non-limiting example, along such a cross-section (shown in FIG. 19A), the portion 1302D may have a minimum width that is approximately aligned with the top surface of the STIs 600, which may range from about 5 nanometers (nm) to about 10 nm, and a maximum width that is approximately aligned with the bottom surface of the STIs 600, which may range from about 10 nanometers (nm) to about 40 nm. The portion 1302E may have a maximum width that is approximately aligned with the bottom surface of the STIs 600, which may range from about 10 nanometers (nm) to about 40 nm, and a minimum width that is embedded in the substrate 302, which may range from about 5 nm to about 10 nm. A total height of the portions 1302D and 1302E may range from about 80 nm to about 120 nm, for example.

Similarly, in FIG. 19B (along the lengthwise direction of the removed semiconductor fin 404B), the portion 1302C can have almost vertical sidewalls $1302CS_2$; the portion 1302D can have tilted sidewalls $1302DS_2$ that face each other and are separated by an increasing spacing (when running along the direction extending toward the substrate 302); and the portion 1302E can have tilted sidewalls $1302ES_2$ that face each other and are separated by an decreasing spacing (when running along the direction extending toward the substrate 302).

As a non-limiting example, along such a cross-section (shown in FIG. 19B), the portion 1302D may have a minimum width that is approximately aligned with the top surface of the STIs 600, which may range from about 10 nm to about 30 nm, and a maximum width that is approximately aligned with the bottom surface of the STIs 600, which may range from about 30 nanometers (nm) to about 40 nm. The portion 1302E may have a maximum width that is approximately aligned with the bottom surface of the STIs 600, which may range from about 30 nanometers (nm) to about 40 nm, and a minimum width that is embedded in the substrate 302, which may range from about 10 nm to about 30 nm. A total height of the portions 1302D and 1302E may range from about 80 nm to about 120 nm, for example.

Figure 20A:
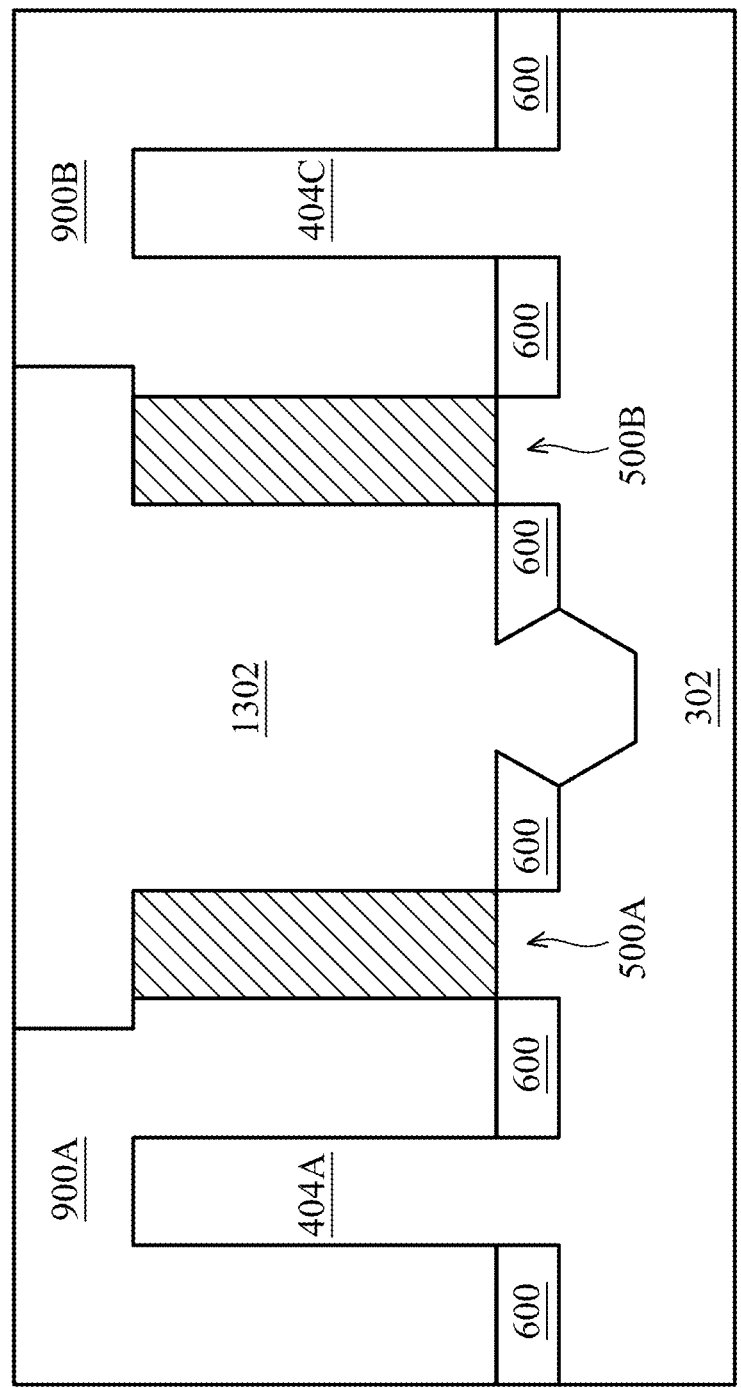
Figure 20B:
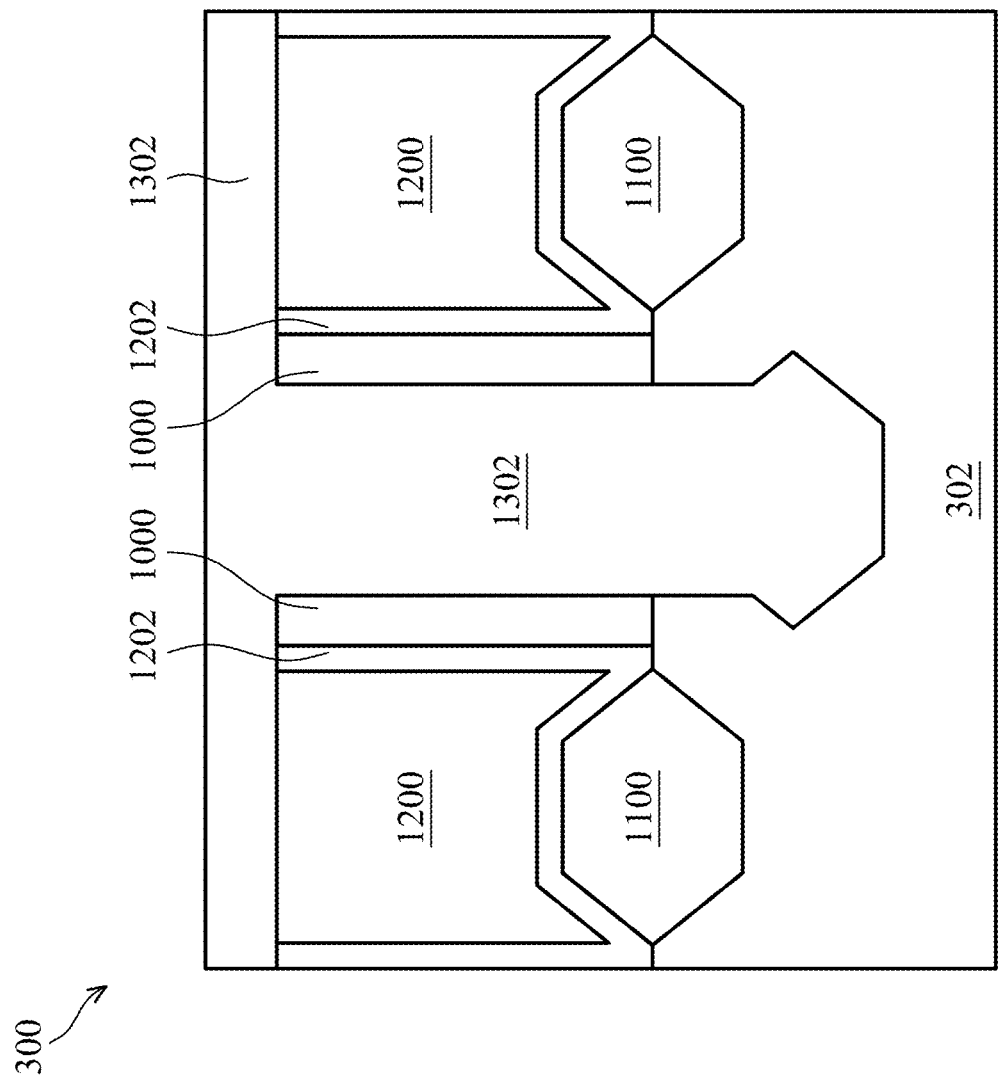

Corresponding to operation 232 of FIG. 2, FIG. 20A is a cross-sectional view of the FinFET device 300 in which the dielectric cut structure 1302 is polished at one of the various stages of fabrication, in some embodiments. The cross-sectional view of the FinFET device 300 in FIG. 20A is cut along the lengthwise direction of a gate structure, e.g., cross-section B-B (as indicated in FIG. 1). Corresponding to the same operation, illustrated in FIG. 20B is a cross-sectional view of the FinFET device 300 cut along the lengthwise direction of the semiconductor fin 404B, e.g., cross-section A-A (as indicated in FIG. 1).

In some embodiments, a CMP process may be performed to planarize the top surfaces of the dielectric cut structure 1302 and the dummy gate structures 900A-B, as shown in FIG. 20A. As such, the dummy gate structures 900A-B, with the dielectric cut structure 1302 disposed therebetween, may be exposed again. Along the other cross-section (shown in FIG. 20B), a portion of the dielectric cut structure 1302 may optionally remain over the ILD 1200.

Figure 21A:
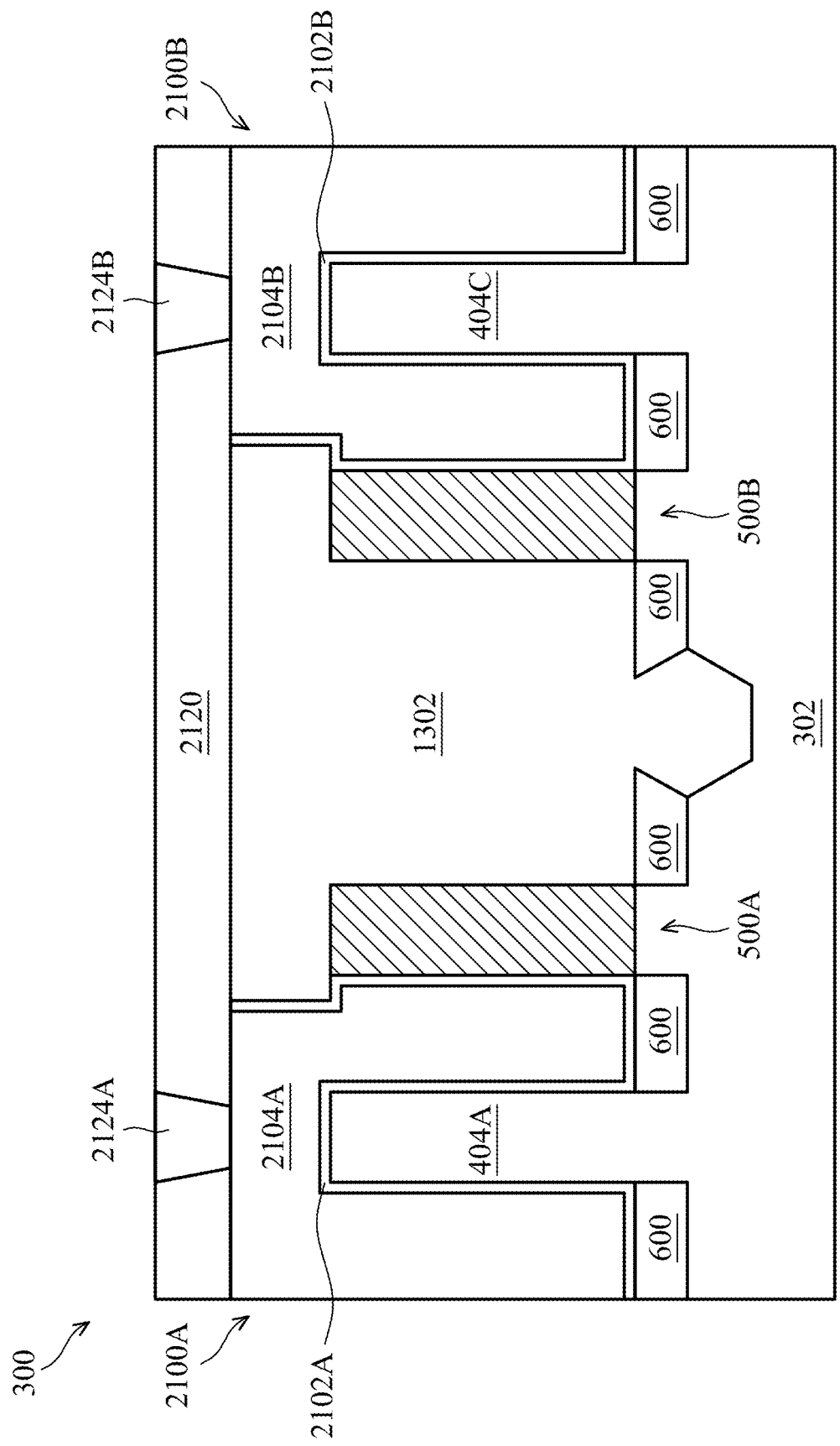
Figure 21B:
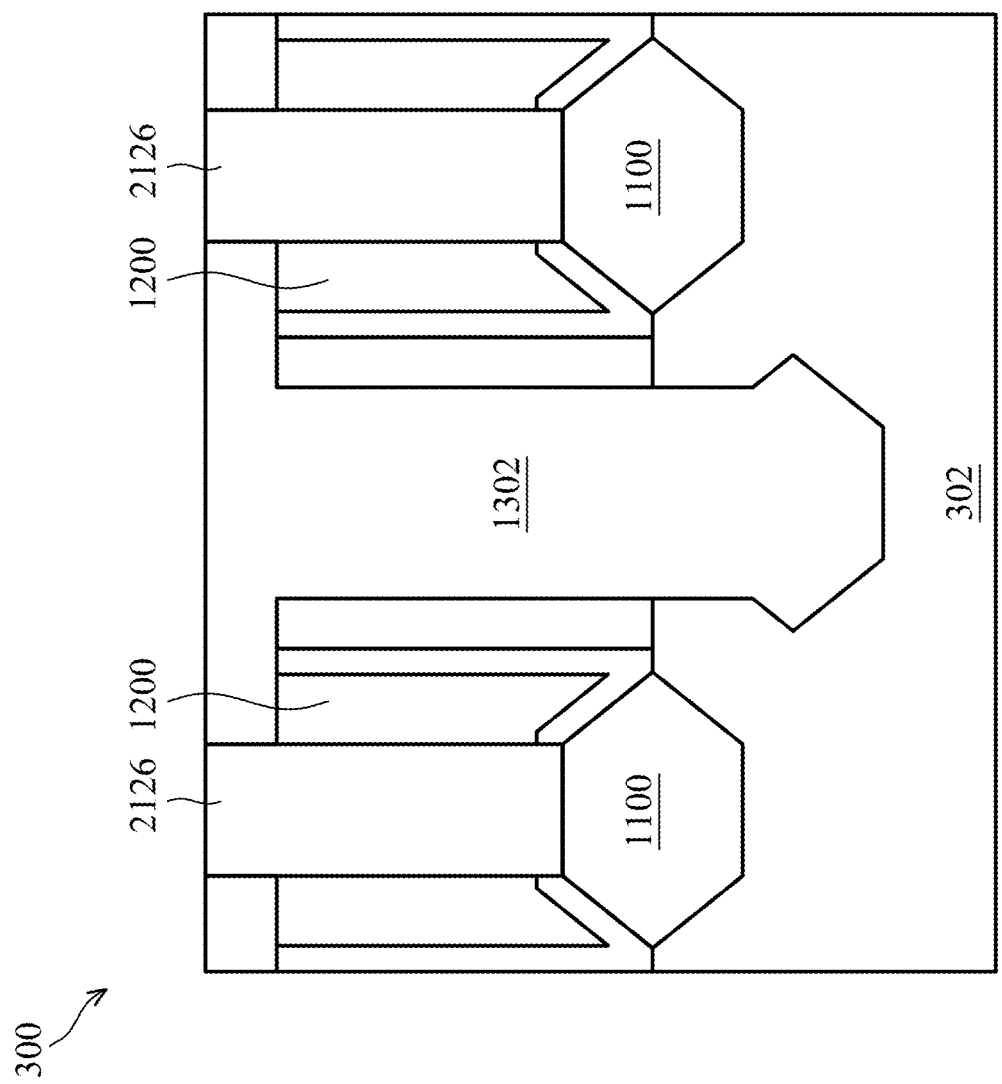

Corresponding to operation 234 of FIG. 2, FIG. 21A is a cross-sectional view of the FinFET device 300 including active gate structures 2100A and 2100B at one of the various stages of fabrication, in some embodiments. The cross-sectional view of the FinFET device 300 in FIG. 21A is cut along the lengthwise direction of a gate structure, e.g., cross-section B-B (as indicated in FIG. 1). Corresponding to the same operation, illustrated in FIG. 21B is a cross-sectional view of the FinFET device 300 cut along the lengthwise direction of the semiconductor fin 404B, e.g., cross-section A-A (as indicated in FIG. 1).

The active gate structures 2100A-B may be formed by replacing the dummy gate structures 900A-B, respectively. As illustrated in FIG. 21A, the active gate structures 2100A and 2100B are separated by the dielectric cut structure 1302 and the dummy fins 500A-B. The active gate structure 2100A can overlay the semiconductor fin 404A; and the active gate structure 2100B can overlay the semiconductor fin 404C. After the active gate structures 2100A-B are formed, the FinFET device 300 can include a number of transistors. For example, a first active transistor, adopting the semiconductor fin 404A as its conduction channel and active gate structure 2100A as its gate, may be formed; and a second active transistor, adopting the active fin 404C as its conduction channel and active gate structure 2100B as its gate, may be formed. Such two transistors are physically and electrically separated by the dielectric cut structure 1302.

The active gate structures 2100A-B can each include a gate dielectric layer (e.g., 2102A, 2102B), a metal gate layer (2103A, 2104B), and one or more other layers that are not shown for clarity. For example, each of the active gate structures 2100A-B may further include a capping layer and a glue layer. The capping layer can protect the underlying work function layer from being oxidized. In some embodiments, the capping layer may be a silicon-containing layer, such as a layer of silicon, a layer of silicon oxide, or a layer of silicon nitride. The glue layer can function as an adhesion layer between the underlying layer and a subsequently formed gate electrode material (e.g., tungsten) over the glue layer. The glue layer may be formed of a suitable material, such as titanium nitride.

The gate dielectric layers 2102A-B are each deposited (e.g., conformally) in a corresponding gate trench to surround (e.g., straddle) one or more fins. For example in FIG. 21A, the gate dielectric layer 2102A is deposited in a gate trench that is formed by removing the dummy gate structure 900A over the semiconductor fin 404A. The gate dielectric layer 2102A can overlay the top surfaces and the sidewalls of the semiconductor fin 404A, one of the sidewalls of the dummy fin 500A, and one of the sidewalls of the dielectric cut structure 1302. The gate dielectric layer 2102B is deposited in a gate trench that is formed by removing the dummy gate structure 900B over the semiconductor fin 404V. The gate dielectric layer 2102B can overlay the top surfaces and the sidewalls of the semiconductor fin 404C, one of the sidewalls of the dummy fin 500B, and the other of the sidewalls of the dielectric cut structure 1302.

The gate dielectric layers 2102A-B each include silicon oxide, silicon nitride, or multilayers thereof. In example embodiments, the gate dielectric layers 2102A-B each include a high-k dielectric material, and in these embodiments, the gate dielectric layers 2102A-B may each have a k value greater than about 7.0, and may include a metal oxide or a silicate of Hf, Al, Zr, La, Mg, Ba, Ti, Pb, or combinations thereof. The formation methods of the gate dielectric layers 2102A-B may include molecular beam deposition (MBD), atomic layer deposition (ALD), PECVD, and the like. A thickness of each of the gate dielectric layers 2102A-B may be between about 8 angstroms (Å) and about 20 Å, as an example.

The metal gate layers 2104A-B may each be formed over the respective gate dielectric layer. The metal gate layer 2104A is deposited in the gate trench over the gate dielectric layer 2102A; and the metal gate layer 2104B is deposited in the gate trench over the gate dielectric layer 2102B. The metal gate layers 2104A-B may each be a P-type work function layer, an N-type work function layer, multi-layers thereof, or combinations thereof, in some embodiments. Accordingly, the metal gate layers 2104A-B may each be referred to as a work function layer, in some embodiments. In the discussion herein, a work function layer may also be referred to as a work function metal. Example P-type work function metals that may be included in the gate structures for P-type devices include TiN, TaN, Ru, Mo, Al, WN, $ZrSi_2$, $MoSi_2$, $TaSi_2$, $NiSi_2$, WN, other suitable P-type work function materials, or combinations thereof. Example N-type work function metals that may be included in the gate structures for N-type devices include Ti, Ag, TaAl, TaAlC, TiAlN, TaC, TaCN, TaSiN, Mn, Zr, other suitable N-type work function materials, or combinations thereof.

A work function value is associated with the material composition of the work function layer, and thus, the material of the work function layer is chosen to tune its work function value so that a target threshold voltage $V_t$ is achieved in the device that is to be formed. The work function layer(s) may be deposited by CVD, physical vapor deposition (PVD), ALD, and/or other suitable process. The thickness of a P-type work function layer may be between about 8 Å and about 15 Å, and the thickness of an N-type work function layer may be between about 15 Å and about 30 Å, as an example.

After replacing the dummy gate structures with the active gate structures, another ILD 2120 can be formed over the workpiece. Next, a number of contacts can be formed to electrically connect the respective structures. For example, gate contacts 2124A and 2124B can be formed to electrically connect the active gate structures 2104A and 2104B, respectively (as illustrated in FIG. 21A); and source/drain contacts 2126 can be formed to electrically connect the source/drain structures 1200 (as illustrated in FIG. 21B).

In one aspect of the present disclosure, a semiconductor device is disclosed. The semiconductor device includes a substrate. The semiconductor device includes a first fin structure that is disposed over the substrate and extends along a first lateral direction. The semiconductor device includes a second fin structure that is disposed over the substrate and also extends along the first lateral direction. The semiconductor device includes a first gate structure that extends along a second lateral direction and straddles the first fin structure, the second lateral direction being perpendicular to the first lateral direction. The semiconductor device includes a second gate structure that extends along the second lateral direction and straddles the second fin structure. The semiconductor device includes a dielectric cut structure that separates the first and second gate structures from each other. The dielectric cut structure includes a first portion having a first width extending along the second lateral direction and a second portion having a second width extending along the second lateral direction. The first width increases along a vertical direction extending into the substrate and the second width decreases along the vertical direction.

In yet another aspect of the present disclosure, a semiconductor device is disclosed. The semiconductor device includes a substrate. The semiconductor device includes a first fin structure that protrudes from the substrate and extends along a first lateral direction. The semiconductor device includes a second fin structure that protrudes from the substrate and extends along the first lateral direction. The semiconductor device includes an isolation structure surrounds respective lower portions of the first and second fin structures. The semiconductor device includes a first gate structure that extends along a second lateral direction and straddles the first fin structure. The second lateral direction is perpendicular to the first lateral direction. The semiconductor device includes a second gate structure that extends along the second lateral direction and straddles the second fin structure. The semiconductor device includes a dielectric cut structure that separates the first and second gate structures from each other and vertically extends through the isolation structure into the substrate. The dielectric cut structure extends into the substrate and comprises a first portion and a second portion. A width of the first portion along the second lateral direction increases with increasing depth into the substrate and a width of the second portion along the second lateral direction decreases with increasing depth into the substrate. The second portion is located below the first portion.

In yet another aspect of the present disclosure, a method of making a semiconductor device is disclosed. The method includes forming a first fin structure, a second fin structure, and a third fin structure over a substrate. The first through third fin structure all extend along a first lateral direction, and the second fin structure is disposed between the first and third fin structures. The method includes forming a dummy gate structure over the first through third fin structures. The dummy gate structure extends along a second lateral direction perpendicular to the first lateral direction. The method includes forming a dielectric cut structure that separates portions of the dummy gate structure overlaying the first and third fin structures, respectively, based on removing the second fin structure. A portion of the dielectric cut structure has a diamond-like profile extending into the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for making a semiconductor device, comprising:
   forming a first fin structure, a second fin structure, and a third fin structure over a substrate, wherein the first through third fin structure all extend along a first lateral direction, and the second fin structure is disposed between the first and third fin structures;
   forming a dummy gate structure over the first through third fin structures, wherein the dummy gate structure extends along a second lateral direction perpendicular to the first lateral direction; and
   forming a dielectric cut structure that separates portions of the dummy gate structure overlaying the first and third fin structures, respectively, based on removing the second fin structure;
   wherein a portion of the dielectric cut structure has a diamond-like profile extending into the substrate.

2. The method of claim 1, wherein the step of forming a dielectric cut structure comprises removing a portion of the dummy gate structure overlaying the second fin structure to form a cavity.

3. The method of claim 2, wherein the step of forming a dielectric cut structure further comprises:
   removing an upper portion of the second fin structure by a first etching process to extend the cavity;
   removing a lower portion of the second fin structure by a second etching process to further extend the cavity;
   removing an upper portion of the substrate by a third etching process to further extend the cavity; and
   filling the cavity with a dielectric material.

4. The method of claim 3, wherein each of the first through third etching processes has a combination of anisotropic etching and isotropic etching.

5. The method of claim 1, wherein the diamond-like profile comprises a first portion and a second portion, wherein a width of the first portion along the second lateral direction increases with increasing depth into the substrate and a width of the second portion along the second lateral direction decreases with increasing depth into the substrate, the second portion being located below the first portion.

6. The method of claim 1, further comprising forming an isolation structure overlaying the substrate and surrounding respective lower portions of the first to third fin structures.

7. The method of claim 6, wherein the step of forming a dielectric cut structure comprises removing a portion of the isolation structure.

8. The method of claim 7, wherein the dielectric cut structure vertically extends through the isolation structure into the substrate.

9. A method for making a semiconductor device, comprising:
   forming a first fin structure, a second fin structure, and a third fin structure over a substrate, wherein the first through third fin structure all extend along a first lateral direction, and the second fin structure is disposed between the first and third fin structures;
   forming an isolation structure overlaying the substrate and surrounding respective lower portions of the first to third fin structures;
   forming a dummy gate structure over the first through third fin structures, wherein the dummy gate structure extends along a second lateral direction perpendicular to the first lateral direction; and
   forming a dielectric cut structure that separates portions of the dummy gate structure overlaying the first and third fin structures, respectively, based on at least removing the second fin structure;
   wherein a portion of the dielectric cut structure has a diamond-like profile extending into the substrate, wherein the diamond-like profile comprises a first portion and a second portion, wherein a width of the first portion along the second lateral direction increases with increasing depth into the substrate and a width of the second portion along the second lateral direction decreases with increasing depth into the substrate, the second portion being located below the first portion.

10. The method of claim 9, wherein the first portion of the dielectric cut structure is laterally aligned with the isolation structure, and the second portion of the dielectric cut structure is laterally aligned with the upper portion of the substrate.

11. The method of claim 9, wherein the width of the first portion has a minimum value near a top surface of the isolation structure.

12. The method of claim 9, wherein the width of the second portion has a minimum value at its lowest point in the substrate.

13. The method of claim 9, wherein the first and second portions of the dielectric cut structure vertically abut to each other.

14. The method of claim 9, wherein the step of forming a dielectric cut structure comprises:
   removing a portion of the dummy gate structure overlaying the second fin structure to form a cavity;

removing an upper portion of the second fin structure by a first etching process to extend the cavity;

removing a lower portion of the second fin structure by a second etching process to further extend the cavity;

removing an upper portion of the substrate by a third etching process to further extend the cavity; and filling the cavity with a dielectric material.

15. The method of claim 14, wherein each of the first through third etching processes has a combination of anisotropic etching and isotropic etching.

16. The method of claim 9, wherein the step of forming a dielectric cut structure comprises removing a portion of the isolation structure.

17. The method of claim 16, wherein the dielectric cut structure vertically extends through the isolation structure into the substrate.

18. A method for making a semiconductor device, comprising:

forming a first fin structure, a second fin structure, and a third fin structure over a substrate, wherein the first through third fin structure all extend along a first lateral direction, and the second fin structure is disposed between the first and third fin structures;

forming an isolation structure overlaying the substrate and surrounding respective lower portions of the first to third fin structures;

forming a dummy gate structure over the first through third fin structures, wherein the dummy gate structure extends along a second lateral direction perpendicular to the first lateral direction; and forming a dielectric cut structure that separates portions of the dummy gate structure overlaying the first and third fin structures, respectively, based on removing the second fin structure and removing a portion of the isolation structure;

wherein a portion of the dielectric cut structure has a diamond-like profile extending into the substrate, wherein the diamond-like profile comprises a first portion and a second portion, wherein a width of the first portion along the second lateral direction increases with increasing depth into the substrate and a width of the second portion along the second lateral direction decreases with increasing depth into the substrate, the second portion being located below the first portion.

19. The method of claim 18, wherein the step of forming a dielectric cut structure comprises:

removing a portion of the dummy gate structure overlaying the second fin structure to form a cavity;

removing an upper portion of the second fin structure by a first etching process to extend the cavity;

removing a lower portion of the second fin structure by a second etching process to further extend the cavity;

removing an upper portion of the substrate by a third etching process to further extend the cavity; and filling the cavity with a dielectric material.

20. The method of claim 18, wherein the dielectric cut structure vertically extends through the isolation structure into the substrate.

* * * * *